United States Patent
Choi et al.

(10) Patent No.: US 12,279,415 B2
(45) Date of Patent: Apr. 15, 2025

(54) METHOD OF FABRICATING SEMICONDUCTOR MEMORY DEVICE HAVING PROTRUDING CONTACT PORTION

(71) Applicant: Samsung Electronics Co., Ltd., Suwon-si (KR)

(72) Inventors: Minsu Choi, Incheon (KR); Myeong-Dong Lee, Seoul (KR); Hyeon-Woo Jang, Suwon-si (KR); Keunnam Kim, Yongin-si (KR); Sooho Shin, Hwaseong-si (KR); Yoosang Hwang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/337,134

(22) Filed: Jun. 19, 2023

(65) Prior Publication Data

US 2023/0337415 A1 Oct. 19, 2023

Related U.S. Application Data

(63) Continuation of application No. 17/192,084, filed on Mar. 4, 2021, now Pat. No. 11,723,191.

(30) Foreign Application Priority Data

Jul. 24, 2020 (KR) ........................ 10-2020-0092310

(51) Int. Cl.
*H10B 12/00* (2023.01)
*G11C 5/12* (2006.01)

(52) U.S. Cl.
CPC .......... *H10B 12/34* (2023.02); *H10B 12/0335* (2023.02); *H10B 12/053* (2023.02); *H10B 12/315* (2023.02)

(58) Field of Classification Search
CPC ......... H01L 27/10823; H01L 27/10814; H01L 27/10855; H01L 27/10876; H10B 12/34;
(Continued)

(56) References Cited

U.S. PATENT DOCUMENTS 7,276,725 B2 10/2007 Eun
8,686,496 B2 4/2014 Mikasa
(Continued)

FOREIGN PATENT DOCUMENTS

CN 111354711 A 6/2020
GB 2400237 B 9/2005
(Continued)

*Primary Examiner* — Antonio B Crite
(74) *Attorney, Agent, or Firm* — Myers Bigel, P.A.

(57) ABSTRACT

Disclosed are a semiconductor memory device and a method of fabricating the same. The device includes a substrate including an active pattern with doped regions, a gate electrode crossing the active pattern between the doped regions, a bit line crossing the active pattern and being electrically connected to one of the doped regions, a spacer on a side surface of the bit line, a first contact coupled to another of the doped regions and spaced apart from the bit line with the spacer interposed therebetween, a landing pad on the first contact, and a data storing element on the landing pad. The another of the doped regions has a top surface, an upper side surface, and a curved top surface that extends from the top surface to the upper side surface. The first contact is in contact with the curved top surface and the upper side surface.

20 Claims, 44 Drawing Sheets

(58) Field of Classification Search
CPC .. H10B 12/0335; H10B 12/53; H10B 12/315; H10B 12/053; H10B 12/03; H10B 12/482
See application file for complete search history.

(56) References Cited

U.S. PATENT DOCUMENTS

| | | | |
|---|---|---|---|
| 8,987,860 | B2 | 3/2015 | Song et al. |
| 9,257,437 | B2 | 2/2016 | Park et al. |
| 9,318,604 | B2 | 4/2016 | Kwon |
| 9,425,200 | B2 | 8/2016 | Hwang et al. |
| 9,520,348 | B2 | 12/2016 | Choi et al. |
| 9,607,994 | B2 | 3/2017 | Kim et al. |
| 9,754,889 | B2 | 9/2017 | Pandey et al. |
| 10,559,570 | B2 | 2/2020 | Nagai |
| 10,573,651 | B2 | 2/2020 | Kim et al. |
| 10,777,272 | B2 | 9/2020 | Aoki |
| 11,778,811 | B2 | 10/2023 | Lee et al. |
| 2010/0200997 | A1 | 8/2010 | Yang |
| 2013/0161781 | A1 | 6/2013 | Lee |
| 2014/0061782 | A1* | 3/2014 | Kim ................ H01L 27/088 257/331 |
| 2014/0159194 | A1* | 6/2014 | Song ................ H10B 12/485 257/522 |
| 2014/0327063 | A1* | 11/2014 | Park ................ H10B 12/0335 257/296 |
| 2015/0035022 | A1 | 2/2015 | Chung |
| 2015/0162335 | A1* | 6/2015 | Kim ................ H10B 12/34 438/618 |
| 2015/0179651 | A1* | 6/2015 | Park ................ H10B 12/485 257/296 |
| 2016/0276273 | A1 | 9/2016 | Kwon et al. |
| 2017/0125283 | A1* | 5/2017 | Lee ................ H10B 12/34 |
| 2018/0175040 | A1* | 6/2018 | Kim ................ H10B 12/0335 |
| 2020/0105763 | A1* | 4/2020 | Wu ................ H10B 12/34 |

FOREIGN PATENT DOCUMENTS

| | | |
|---|---|---|
| KR | 20060061699 A | 6/2006 |
| KR | 20120027700 A | 3/2012 |
| KR | 20120059399 A | 6/2012 |
| KR | 20140075875 A | 6/2014 |
| KR | 20190110921 A | 10/2019 |
| TW | I262574 B | 9/2006 |
| TW | I672697 B | 9/2019 |

* cited by examiner

METHOD OF FABRICATING SEMICONDUCTOR MEMORY DEVICE HAVING PROTRUDING CONTACT PORTION

CROSS-REFERENCE TO RELATED APPLICATION(S)

This application is a continuation of and claims priority to U.S. patent application Ser. No. 17/192,084, filed Mar. 4, 2021, which claims priority under 35 U.S.C. § 119 to Korean Patent Application No. 10-2020-0092310, filed on Jul. 24, 2020, in the Korean Intellectual Property Office, the entire contents of which are hereby incorporated by reference.

BACKGROUND

The present disclosure relates to semiconductor memory devices. Due to their small-size, multifunctional, and/or low-cost characteristics, semiconductor devices are being esteemed as important elements in the electronics industry. A memory device, which is one example of a semiconductor device, is configured to store logical data. With the development of the electronics industry, memory devices are becoming more highly integrated. As a result, line widths of elements constituting the memory devices are decreasing.

Higher reliability, in addition to the higher integration density, may be demanded for memory devices. However, an increase in integration density of memory devices may cause deterioration in reliability of the memory devices. Thus, much research is being conducted to improve the reliability of memory devices.

SUMMARY

An embodiment of the inventive concept provides a semiconductor memory device with improved electric characteristics.

An embodiment of the inventive concept provides a method of fabricating a semiconductor memory device with improved electric characteristics.

According to an embodiment of the inventive concept, a semiconductor memory device may include a substrate including a first active pattern, the first active pattern including a first source/drain region and a second source/drain region, a gate electrode crossing the first active pattern, extending in a first direction, and crossing a region between the first and second source/drain regions, a bit line crossing the first active pattern and extending in a second direction, the bit line being electrically connected to the first source/drain region, a spacer on a side surface of the bit line, a first contact coupled to the second source/drain region and spaced apart from the bit line with the spacer interposed therebetween, a landing pad on the first contact, and a data storing element on the landing pad. The second source/drain region may have a top surface, an upper side surface, and a curved top surface that extends from the top surface to the upper side surface. The first contact may be in contact with the curved top surface and the upper side surface.

According to an embodiment of the inventive concept, a semiconductor memory device may include a substrate having a first active pattern, a second active pattern, and a third active pattern that are sequentially arranged in a first direction, a bit line crossing the second active pattern and extending in a second direction, the bit line being electrically connected to the second active pattern, a first contact coupled to the first active pattern, a second contact coupled to the third active pattern, landing pads on the first and second contacts, respectively, and data storing elements on the landing pads, respectively. The first contact may be in contact with a curved top surface of the first active pattern, and the second contact may be in contact with a curved top surface of the third active pattern. The lowermost level of the curved top surface of the first active pattern may be at a first level, the lowermost level of the curved top surface of the third active pattern may be at a second level, the lowermost level of the first contact may be at a third level, and the lowermost level of the second contact may be at a fourth level. A difference between the first level and the second level may be larger than a difference between the third level and the fourth level.

According to an embodiment of the inventive concept, a semiconductor memory device may include a substrate including an active pattern, the active pattern having a longitudinal axis parallel to a first direction and including a first source/drain region and a pair of second source/drain regions that are spaced apart from each other in the first direction with the first source/drain region interposed therebetween, a device isolation layer on the substrate, in a first trench defining the active pattern, a pair of gate electrodes crossing the active pattern and extending in a second direction, each of the pair of gate electrodes being in a second trench between the first and second source/drain regions, a gate dielectric layer interposed between each of the pair of gate electrodes and the active pattern, a gate capping layer on each of the pair of gate electrodes, in the second trench, an insulating layer on the substrate, a line structure on the insulating layer to cross the active pattern and extend in a third direction, the line structure including a conductive pattern that penetrates the insulating layer and is coupled to the first source/drain region, a bit line on the conductive pattern, and a barrier pattern between the bit line and the conductive pattern, a pair of spacers on opposite side surfaces of the line structure, respectively, a first contact and a second contact that are in contact with a first one and a second one of the pair of second source/drain regions, respectively, the first and second contacts being spaced apart from the line structure by the pair of spacers, landing pads on the first and second contacts, respectively, first electrodes on the landing pads, respectively, a second electrode on the first electrodes, and a dielectric layer interposed between the first electrodes and the second electrode. A bottom surface of the conductive pattern in contact with the first source/drain region may be at a level higher than the lowermost level of the first contact.

According to an embodiment of the inventive concept, a method of fabricating a semiconductor memory device may include patterning a substrate to form a first trench defining an active pattern, forming a device isolation layer in the first trench, forming a gate electrode to cross the active pattern and to extend in a first direction, forming a first source/drain region and a second source/drain region in an upper portion of the active pattern, the first and second source/drain regions being adjacent to respective opposite sides of the gate electrode, forming an insulating layer on the active pattern, forming a line structure on the insulating layer to cross the active pattern and to extend in a second direction, the line structure including a bit line electrically connected to the first source/drain region and a mask pattern on the bit line, forming a spacer on a side surface of the line structure, forming a contact to penetrate the insulating layer and to be coupled to the second source/drain region, forming a landing pad on the contact, and forming a data storing element on the landing pad. The forming of the contact may include performing an anisotropic etching process using the mask pattern and the spacer as a mask to form a first contact hole penetrating the insulating layer, selectively recessing an upper portion of the device isolation layer exposed by the first contact hole to form a vertical extension hole exposing an upper side surface of the active pattern, and forming a conductive material in the first contact hole and the vertical extension hole.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
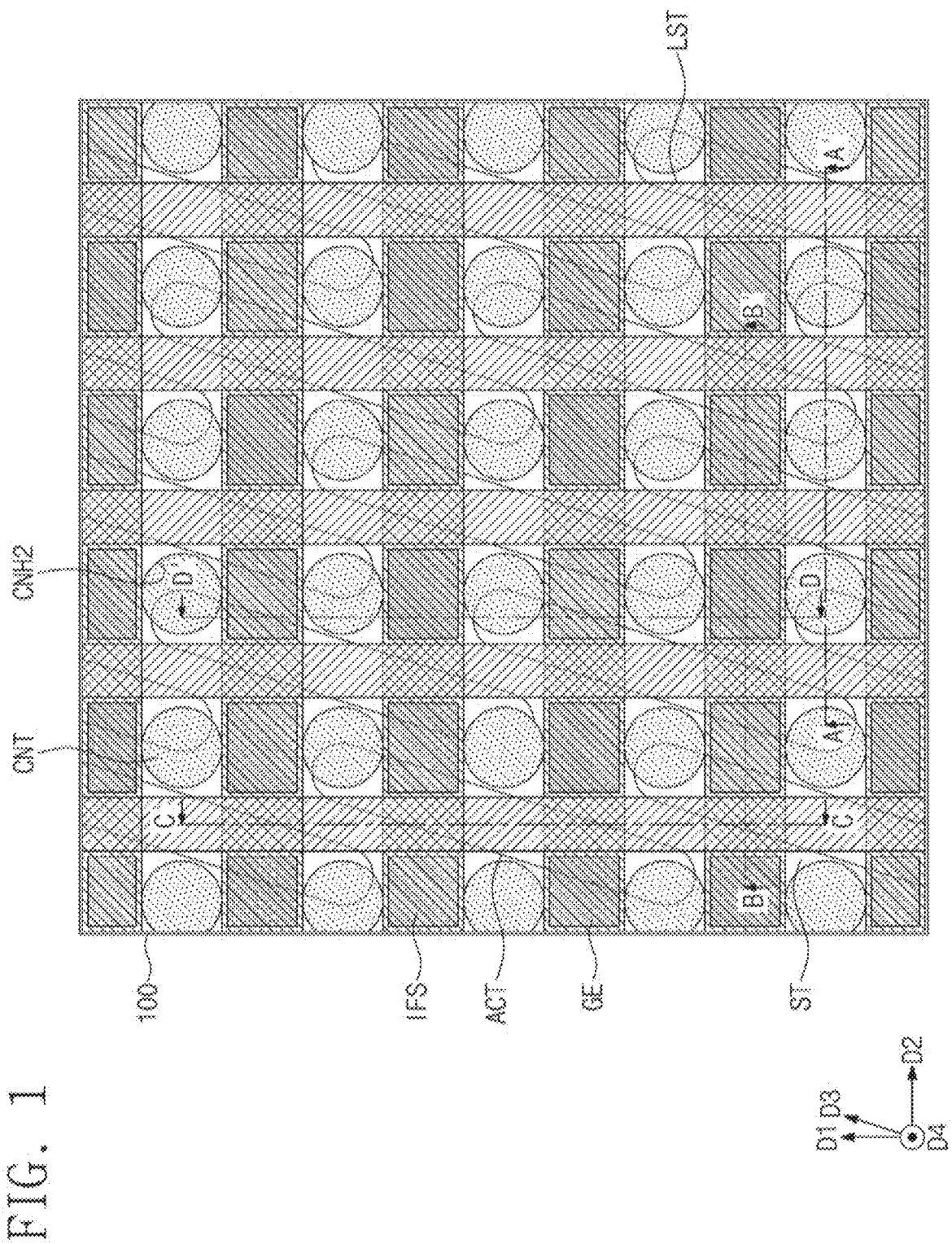
FIG. 1 is a plan view illustrating a semiconductor device according to an embodiment of the inventive concept.

FIG. 1 is a plan view illustrating a semiconductor device according to an embodiment of the inventive concept. FIGS. 2A, 2B, 2C, and 2D are sectional views taken along lines A-A', B-B', C-C', and D-D', respectively, of FIG. 1. FIG. 3 is an enlarged sectional view of a region M of FIG. 2A.

Referring to FIGS. 1 and 2A to 2D, a device isolation layer ST may be provided on a substrate 100 to define active patterns ACT. As an example, the substrate 100 may be a semiconductor substrate, which is formed of or includes silicon, germanium, or silicon-germanium. The device isolation layer ST may include a silicon oxide layer.

The active patterns ACT may be formed by patterning an upper portion of the substrate 100. Each of the active patterns ACT may be extended in a third direction D3 that is parallel to a top surface of the substrate 100. In other words, each of the active patterns ACT may have a longitudinal axis parallel to the third direction D3. The active patterns ACT may be two-dimensionally arranged in a first direction D1 and a second direction D2. The active patterns ACT may be spaced apart from each other in the third direction D3.

Each of the active patterns ACT may have a decreasing width, in a direction (i.e., a fourth direction D4) perpendicular to the top surface of the substrate 100. In particular, each of the active patterns ACT may have a decreasing width, with increasing distance from a bottom surface of the substrate 100.

First and second trenches TR1 and TR2 may be defined between the active patterns ACT. The device isolation layer ST may be in (e.g., may fill) the first and second trenches TR1 and TR2 between the active patterns ACT. The first trench TR1 may be defined between a pair of active patterns ACT, which are adjacent to each other in the second direction D2. The second trench TR2 may be defined between a pair of active patterns ACT, which are adjacent to each other in the third direction D3.

A distance between the adjacent pair of active patterns ACT in the second direction D2 may be smaller than a distance between the adjacent pair of active patterns ACT in the third direction D3. Moreover, the second trench TR2 may be deeper than the first trench TR1. In other words, a bottom of the second trench TR2 may be lower than a bottom of the first trench TR1 (e.g., see FIG. 2B).

An upper portion of each of the active patterns ACT may include a first source/drain region SD1 and a pair of second source/drain regions SD2. The first source/drain region SD1 may be positioned between the pair of second source/drain regions SD2. In other words, when viewed in a plan view, (i) one of the second source/drain regions SD2, (ii) the first source/drain region SD1, and (iii) another of the second source/drain regions SD2 may be sequentially arranged in the third direction D3.

Figure 2A:
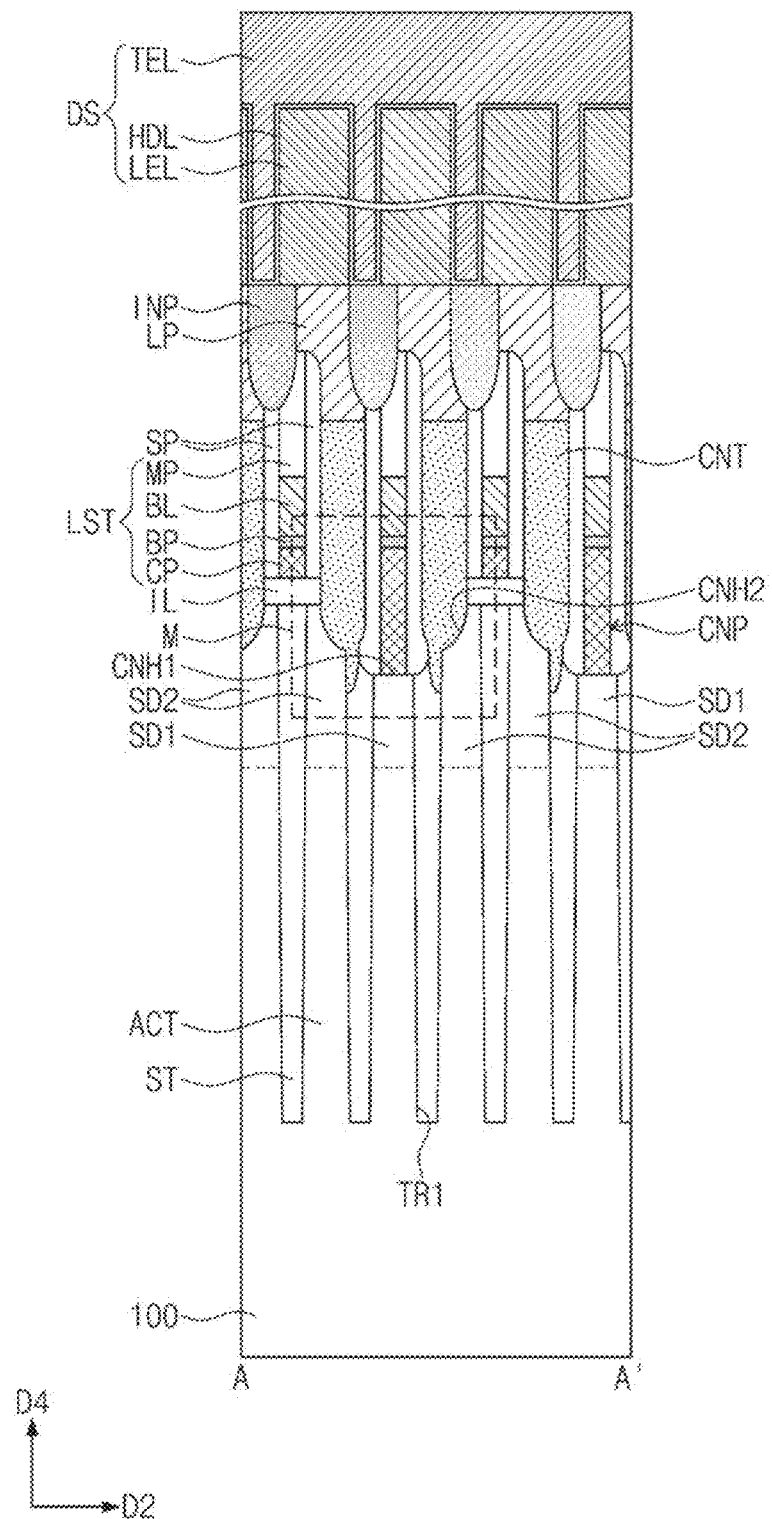
FIGS. 2A, 2B, 2C, and 2D are sectional views taken along lines A-A', B-B', C-C', and D-D', respectively, of FIG. 1.
Figure 2B:
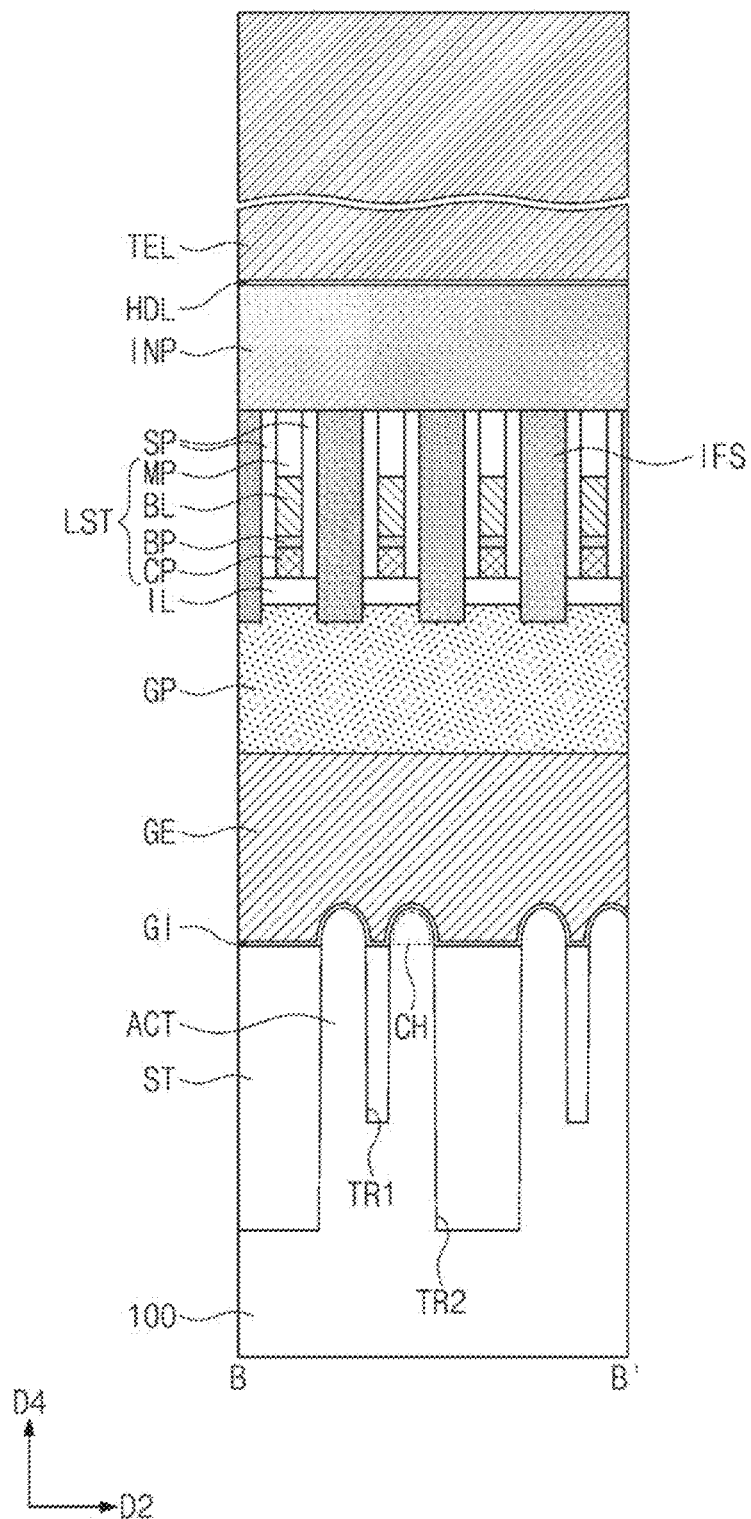
Figure 2C:
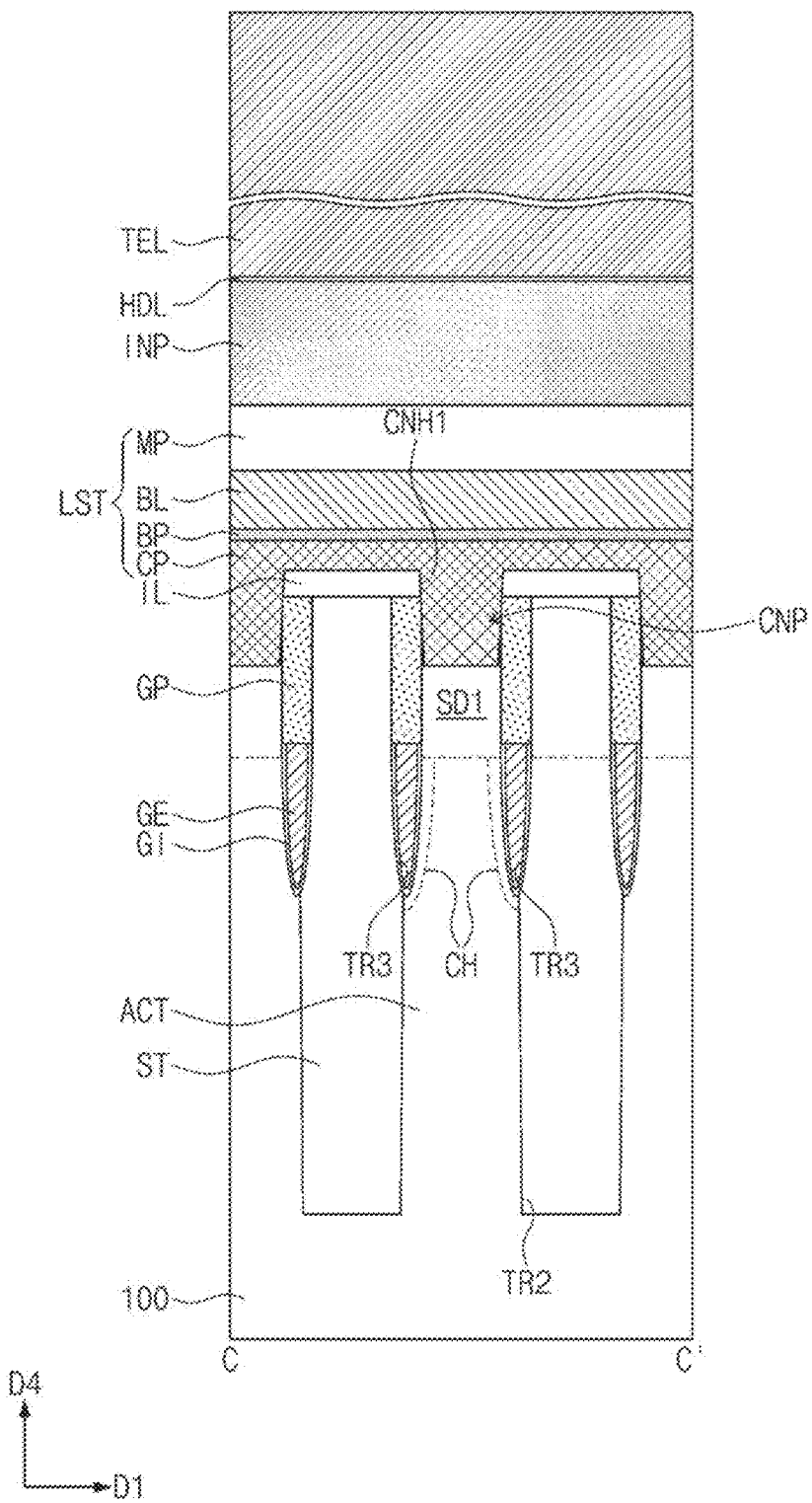
Figure 2D:
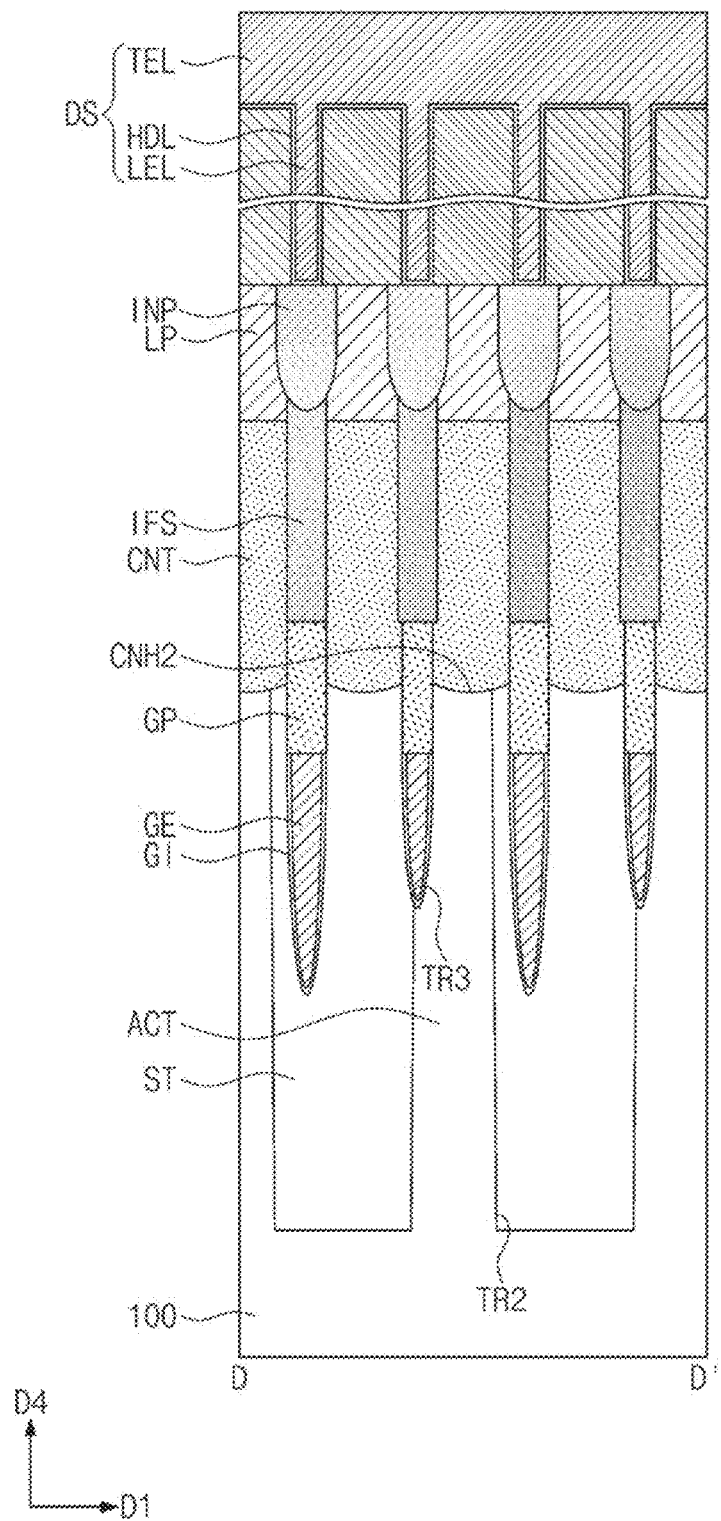
Figure 3:
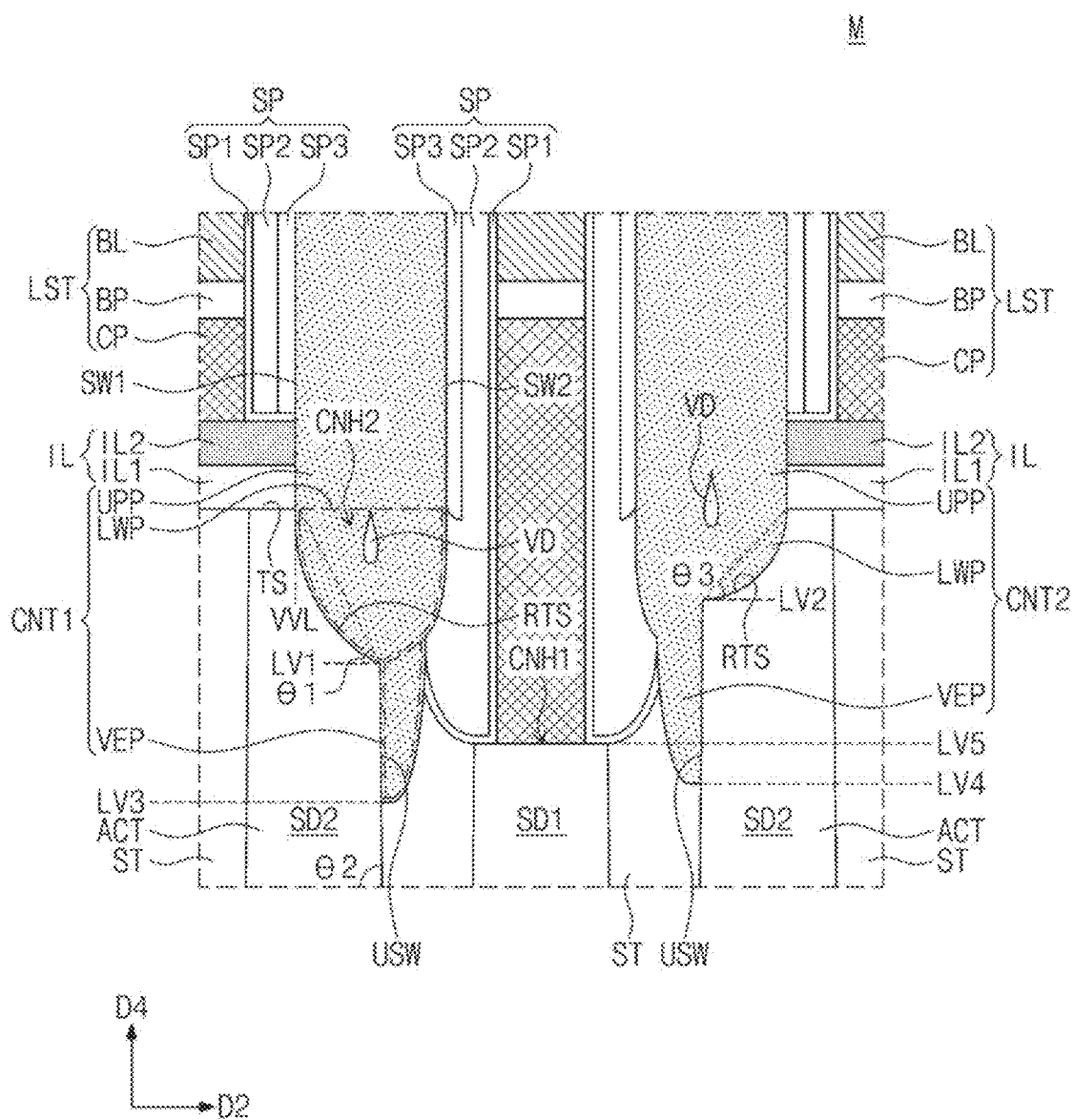
FIG. 3 is an enlarged sectional view of a region M of FIG. 2A.

A pair of third trenches TR3 may be defined in each of the active patterns ACT (e.g., see FIG. 2C). Each of the third trenches TR3 may be defined between the first source/drain region SD1 and the second source/drain region SD2. The third trench TR3 may be provided to penetrate an upper portion of the active pattern ACT and may be downwardly extended from a top surface of the active pattern ACT toward the bottom surface of the substrate 100. A bottom of the third trench TR3 may be higher than the bottoms of the first and second trenches TR1 and TR2.

The upper portion of each of the active patterns ACT may further include a pair of channel regions CH. When viewed in a plan view, the channel region CH may be interposed between the first source/drain region SD1 and the second source/drain region SD2. The channel region CH may be located below the third trench TR3 (e.g., see FIG. 2C). Thus, the channel region CH may be located to be lower than the first and second source/drain regions SD1 and SD2.

Gate electrodes GE may be provided to cross the active patterns ACT and the device isolation layer ST. The gate electrodes GE may be provided in the third trenches TR3, respectively. The gate electrodes GE may be extended in the second direction D2 and parallel to each other. The pair of gate electrodes GE may be provided on the pair of channel regions CH of the active pattern ACT. In other words, when viewed in a plan view, the gate electrode GE may be interposed between the first source/drain region SD1 and the second source/drain region SD2. A top surface of the gate electrode GE may be lower than the top surface of the active pattern ACT (e.g., a top surface of the first source/drain region SD1 or a top surface of the second source/drain region SD2).

Referring back to FIG. 2C, an upper portion of the gate electrode GE may be adjacent to the first source/drain region SD1 of the active pattern ACT. A lower portion of the gate electrode GE may be adjacent to the channel region CH.

Referring to FIGS. 1 and 2A to 2D, a gate dielectric layer GI may be interposed between the gate electrode GE and the active pattern ACT. A gate capping layer GP may be provided on the gate electrode GE. The gate capping layer GP may be on (e.g., may cover) the top surface of the gate electrode GE. A top surface of the gate capping layer GP may be coplanar with the top surface of the active pattern ACT.

The gate electrode GE may be formed of or include at least one of conductive metal nitrides (e.g., titanium nitride or tantalum nitride) and/or metallic materials (e.g., titanium, tantalum, tungsten, copper, or aluminum). The gate dielectric layer GI may be formed of or include at least one of silicon oxide, silicon nitride, silicon oxynitride, and/or high-k dielectric materials. In an embodiment, the high-k dielectric materials may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof. The gate capping layer GP may include a silicon oxide layer, a silicon nitride layer, and/or a silicon oxynitride layer.

An insulating layer IL may be provided on the substrate 100. The insulating layer IL may include first contact holes CNH1 exposing the first source/drain regions SD1 of the active patterns ACT. In detail, referring to FIG. 3, the insulating layer IL may include a first insulating layer IL1 and a second insulating layer IL2, which are sequentially stacked. The second insulating layer IL2 may have a dielectric constant higher than the first insulating layer IL1. For example, the first insulating layer IL1 may include a silicon oxide layer, and the second insulating layer IL2 may include a silicon oxynitride layer.

Line structures LST may be provided on the insulating layer IL to extend in the first direction D1 and parallel to each other. The line structures LST may be arranged (i.e., spaced apart from each other) in the second direction D2. When viewed in a plan view, the line structures LST may be provided to perpendicularly cross the gate electrodes GE (e.g., see FIG. 1). A pair of spacers SP may be provided on opposite side surfaces of each of the line structures LST. The spacers SP may be formed of or include at least one of silicon oxide, silicon nitride, and/or silicon oxynitride.

In more detail, referring to FIG. 3, each of the spacers SP may include a first spacer SP1, a second spacer SP2, and a third spacer SP3. The first spacer SP1 may directly cover a side surface of the line structure LST. The second spacer SP2 may be interposed between the first spacer SP1 and the third spacer SP3. The second spacer SP2 may be formed of an insulating material whose dielectric constant is lower than the first spacer SP1 and the third spacer SP3. As an example, the first spacer SP1 and the third spacer SP3 may be formed of or include silicon nitride, and the second spacer SP2 may be formed of or include silicon oxide. As another example, the second spacer SP2 may be formed of the air; that is, the second spacer SP2 may be an air spacer.

Each of the line structures LST may include a conductive pattern CP, a barrier pattern BP, a bit line BL, and a mask pattern MP, which are sequentially stacked. The conductive pattern CP may include a contact portion CNP, which fills the first contact hole CNH1 and is coupled to the first source/drain region SD1. In more detail, the contact portion CNP may penetrate the insulating layer IL and may be extended toward the bottom surface of the substrate 100. The contact portion CNP may be in direct contact with the first source/drain region SD1.

The barrier pattern BP may prevent or suppress a metallic material in the bit line BL from being diffused into the conductive pattern CP. The bit line BL may be electrically connected to the first source/drain region SD1 through the barrier pattern BP and the conductive pattern CP.

The conductive pattern CP may be formed of or include at least one of various doped semiconductor materials (doped silicon, doped germanium, and so forth). The barrier pattern BP may be formed of or include at least one of various conductive metal nitrides (e.g., titanium nitride or tantalum nitride). The bit line BL may be formed of or include at least one of various metallic materials (e.g., titanium, tantalum, tungsten, copper, or aluminum).

A plurality of insulating fences IFS may be provided on the gate capping layer GP. Each of the insulating fences IFS may penetrate the insulating layer IL and may be extended to an upper portion of the gate capping layer GP.

Referring back to FIG. 1, the insulating fences IFS may be two-dimensionally arranged in the first direction D1 and the second direction D2. In detail, the insulating fences IFS may be arranged in the second direction D2, on the gate capping layer GP extending in the second direction D2. The insulating fences IFS and the line structures LST may be alternately arranged in the second direction D2.

Contacts CNT may be provided to penetrate the insulating layer IL and may be coupled to the second source/drain regions SD2, respectively. Each of the contacts CNT may fill a second contact hole CNH2, which is formed by partially etching an upper portion of the second source/drain region SD2. Referring back to FIG. 2A, the contact CNT may be in direct contact with the second source/drain region SD2 exposed through the second contact hole CNH2. In addition, the contact CNT may be in contact with the side surface of the spacer SP and the top surface of the device isolation layer ST. The contact CNT may be spaced apart from the line structure LST, which is adjacent thereto, by the spacer SP. Each of the contacts CNT may be formed of or include at least one of various doped semiconductor materials (doped silicon, doped germanium, and so forth).

Referring back to FIG. 1, the contacts CNT may be two-dimensionally arranged in the first direction D1 and the second direction D2. In detail, the contacts CNT and the line structures LST may be alternately arranged in the second direction D2. The contacts CNT and the insulating fences IFS may be alternately arranged in the first direction D1.

Landing pads LP, which are respectively coupled to the contacts CNT, may be provided on the contacts CNT. The landing pads LP may be electrically connected to the second source/drain regions SD2, respectively, through the contacts CNT. The landing pad LP may be misaligned from the contact CNT. For example, the landing pad LP may be offset from the center of the contact CNT (e.g., see FIG. 2A). The landing pads LP may be formed of or include at least one of various metallic materials (e.g., titanium, tantalum, tungsten, copper, or aluminum).

An insulating pattern INP may be provided on the mask patterns MP. The insulating pattern INP may define the planar shape of the landing pads LP. Adjacent ones of the landing pads LP may be spaced apart from each other by the insulating pattern INP.

A data storing element DS may be provided on the landing pads LP. In detail, the data storing element DS may include first electrodes LEL provided on the landing pads LP, respectively. The first electrodes LEL may be connected to the landing pads LP, respectively. The data storing element DS may further include a second electrode TEL on the first electrodes LEL and a dielectric layer HDL between the first electrodes LEL and the second electrode TEL. The first electrode LEL, the dielectric layer HDL, and the second electrode TEL may constitute a capacitor which can be used to store data.

Each of the first electrodes LEL may be provided in the form of a solid pillar, but the inventive concept is not limited to this example. For example, each of the first electrodes LEL may be shaped like a cylinder with a closed bottom. The first electrodes LEL may be arranged in zigzags in the first or second direction D1 or D2 to form a honeycomb-shaped arrangement. Alternatively, the first electrodes LEL may be arranged in a matrix shape in the first and second directions D1 and D2.

Each of the first electrodes LEL may be formed of or include at least one of, for example, impurity-doped silicon, metals (e.g., tungsten), or conductive metal compounds (e.g., titanium nitride). The dielectric layer HDL may be formed of or include at least one of various high-k dielectric materials (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof). The second electrode TEL may be formed of or include at least one of doped silicon, ruthenium (Ru), ruthenium oxide (RuO), platinum (Pt), platinum oxide (PtO), iridium (Ir), iridium oxide (IrO), strontium ruthenate (SrRuO (SRO)), barium-containing strontium ruthenate ((Ba,Sr)RuO (BSRO)), calcium ruthenate (CaRuO (CRO)), barium ruthenate (BaRuO), strontium-doped lanthanum cobalt oxide (La(Sr,Co)O), titanium (Ti), titanium nitride (TiN), tungsten (W), tungsten nitride (WN), tantalum (Ta), tantalum nitride (TaN), titanium aluminum nitride (TiAlN), titanium silicon nitride (TiSiN), tantalum aluminum nitride (TaAlN), tantalum silicon nitride (TaSiN), or combinations thereof.

The contact CNT according to an embodiment of the inventive concept will be described in more detail with reference to FIG. 3. The pair of contacts CNT may be respectively disposed at both sides of each line structure LST (e.g., each bit line BL). In the present embodiment, the contact CNT disposed at a side of the bit line BL will be referred to as a first contact CNT1, and the contact CNT disposed at an opposite side of the bit line BL will be referred to as a second contact CNT2. First, the first contact CNT1 will be described in more detail with reference to FIG. 3.

The first contact CNT1 may include a vertically-extended portion VEP, a lower portion LWP, and an upper portion UPP. The lower portion LWP may be provided in the second contact hole CNH2, which is formed to be lower than the top surface of the substrate 100 (i.e., a top surface TS of the active pattern ACT). The upper portion UPP may be provided on the lower portion LWP. The upper portion UPP may have a first side surface SW1 and a second side surface SW2, which are opposite to each other in the second direction D2. The first side surface SW1 may be in contact with the third spacer SP3, and the second side surface SW2 may be in contact with another third spacer SP3.

The second source/drain region SD2 may have a recessed top surface RTS, which is extended from the top surface TS (which may be a planar/flat uppermost region) of the active pattern ACT to an upper side surface USW of the active pattern ACT. As used herein, the term "recessed" may refer to a non-planar (i.e., curved) portion. For example, the recessed top surface RTS of the second source/drain region SD2 may have an average slope defining a first angle θ1 with respect to a first level LV1. The upper side surface USW of the active pattern ACT may have a slope defining a second angle θ2 with respect to the second direction D2. The second angle θ2 may be close to the right angle (i.e., close to 90 degrees). The first angle θ1 may be smaller than the second angle θ2. The first angle θ1 may range from 40° to 80°.

The lower portion LWP of the first contact CNT1 may directly cover the recessed top surface RTS. Meanwhile, the lower portion LWP of the first contact CNT1 may be downward extended to cover just the recessed top surface RTS but may not be horizontally expanded. For example, if a vertical imaginary line VVL is defined to vertically extend from the first side surface SW1 of the first contact CNT1, the lower portion LWP of the first contact CNT1 may have a profile, which is gradually spaced apart from the vertical imaginary line VVL in the second direction D2 as a distance from the bottom of the substrate 100 decreases.

The first contact CNT1 may further include a void VD. For example, the lower portion LWP of the first contact CNT1 may include the void VD. In the present embodiment, the void VD in the first contact CNT1 may have a relatively small size. This is because, since the width of the second contact hole CNH2 is not sharply increased, the second contact hole CNH2 can be well filled with a conductive material when the first contact CNT1 is formed.

The vertically-extended portion VEP of the first contact CNT1 may be extended from (i.e., may downwardly protrude from) the lower portion LWP toward the bottom of the substrate 100. The vertically-extended portion VEP may be provided to penetrate an upper portion of the device isolation layer ST. The vertically-extended portion VEP may be extended into the device isolation layer ST along the upper side surface USW of the active pattern ACT. The vertically-extended portion VEP may cover the upper side surface USW of the active pattern ACT. In other words, the vertically-extended portion VEP may be in contact with the upper side surface USW of the active pattern ACT. The lowermost level of the first contact CNT1 (i.e., the lowermost level LV3 of the vertically-extended portion VEP) may be lower than a level LV5 of the bottom surface of the conductive pattern CP in contact with the first source/drain region SD1.

In the present embodiment, the contact CNT may be extended toward the bottom of the substrate 100 to be in contact with the recessed top surface RTS of the active pattern ACT and the upper side surface USW of the active pattern ACT sequentially. In other words, a contact area between the contact CNT and the second source/drain region SD2 may be relatively increased.

Hereinafter, the second contact CNT2 will be described. Features of the second contact CNT2 that are different from those of the first contact CNT1 may be mainly described, without redundant description. FIG. 3 illustrates an example, in which the second contact CNT2 is formed in a misaligned manner. In detail, FIG. 3 illustrates an example, in which the first contact CNT1 is formed at a desired position but the second contact CNT2 is formed at an offset position in the second direction D2.

The lower portion LWP of the second contact CNT2 may be smaller than the lower portion LWP of the first contact CNT1. In detail, the lowermost level of the recessed top surface RTS in contact with the lower portion LWP of the first contact CNT1 may be positioned at a first level LV1.

The lowermost level of the recessed top surface RTS in contact with the lower portion LWP of the second contact CNT2 may be positioned at a second level LV2. The second level LV2 may be higher than the first level LV1. The recessed top surface RTS in contact with the second contact CNT2 may have an average slope given as a third angle θ3. The third angle θ3 may be smaller than the first angle θ1.

The lowermost level of the vertically-extended portion VEP of the first contact CNT1 may be positioned at a third level LV3. The lowermost level of the vertically-extended portion VEP of the second contact CNT2 may be positioned at a fourth level LV4. The fourth level LV4 may be higher than the third level LV3.

Meanwhile, a difference between the first level LV1 and the second level LV2 may be greater than a difference between the third level LV3 and the fourth level LV4. In other words, the difference between the third level LV3 and the fourth level LV4 may be relatively small. That is, even when the contacts CNT are formed in a misaligned manner, a difference or variation in vertical level between the lowermost points of the contacts CNT may be smaller.

A structural variation between the contacts CNT caused by the misalignment may result in various technical issues, such as a variation in doping profile of the second source/drain region SD2 and variations in electric characteristics of P-N junctions and metallurgical junctions. Furthermore, the structural variation may lead to a problem, such as gate-induced-drain-leakage (GIDL). However, according to an embodiment of the inventive concept, as described above, the vertically-extended portion VEP may reduce a structural variation between the contacts CNT caused by the misalignment. Accordingly, it may be possible to suppress the GIDL issue in the semiconductor device and to improve electric characteristics of the semiconductor device.

Figure 4:
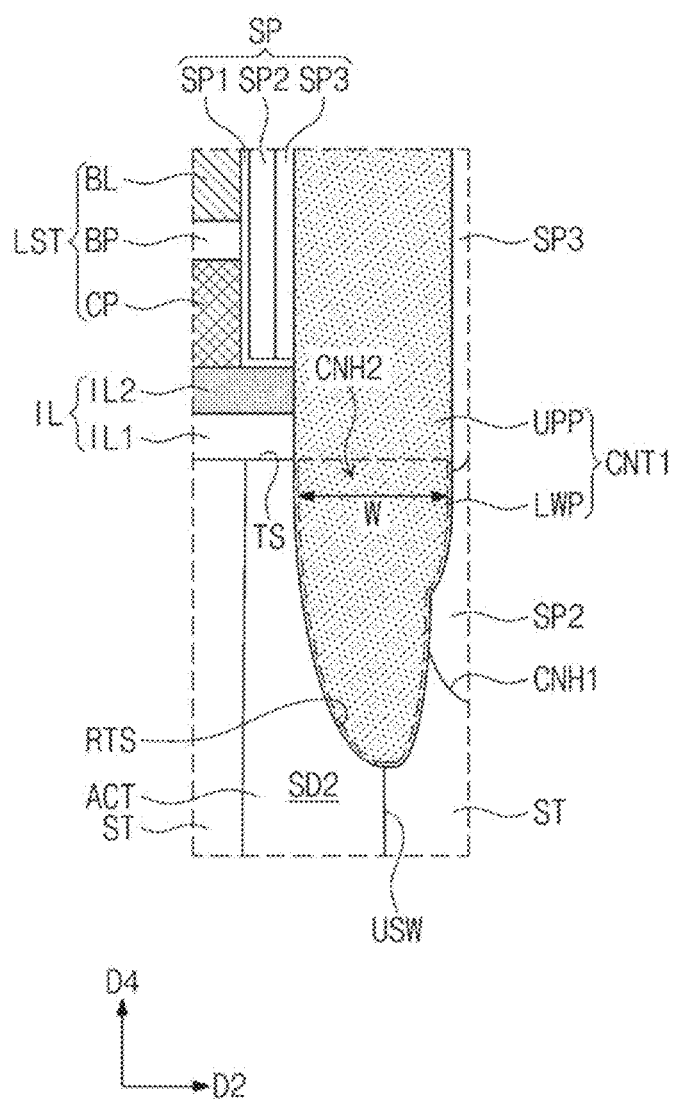
FIG. 4 is a sectional view illustrating another example of a first contact of FIG. 3.
Figure 5:
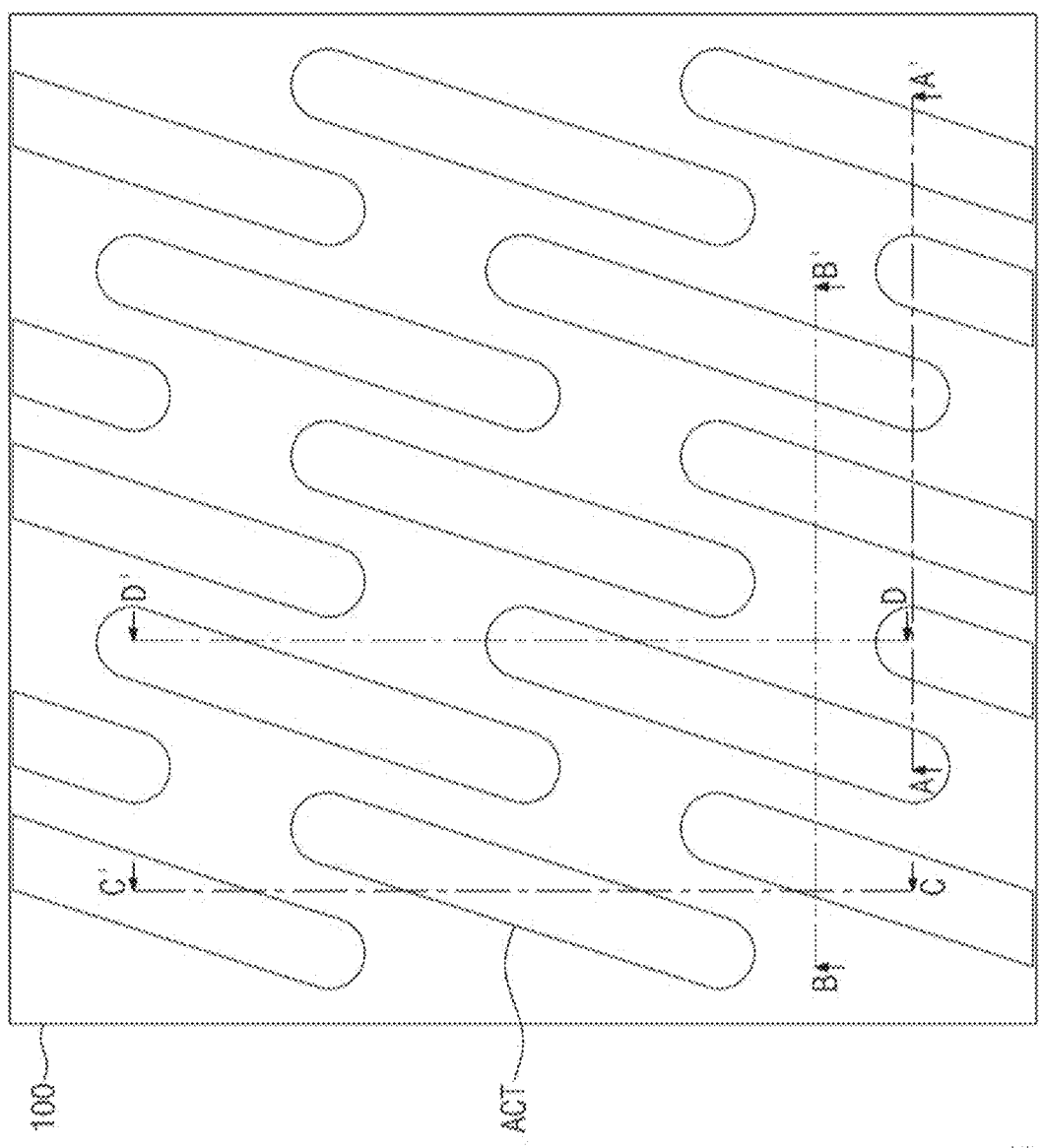
FIGS. 5, 7, 9, 11, 13, 15, and 17 are plan views illustrating a method of fabricating a semiconductor device, according to an embodiment of the inventive concept.
Figure 5:
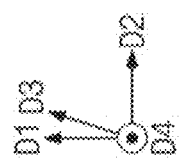
Figure 6A:
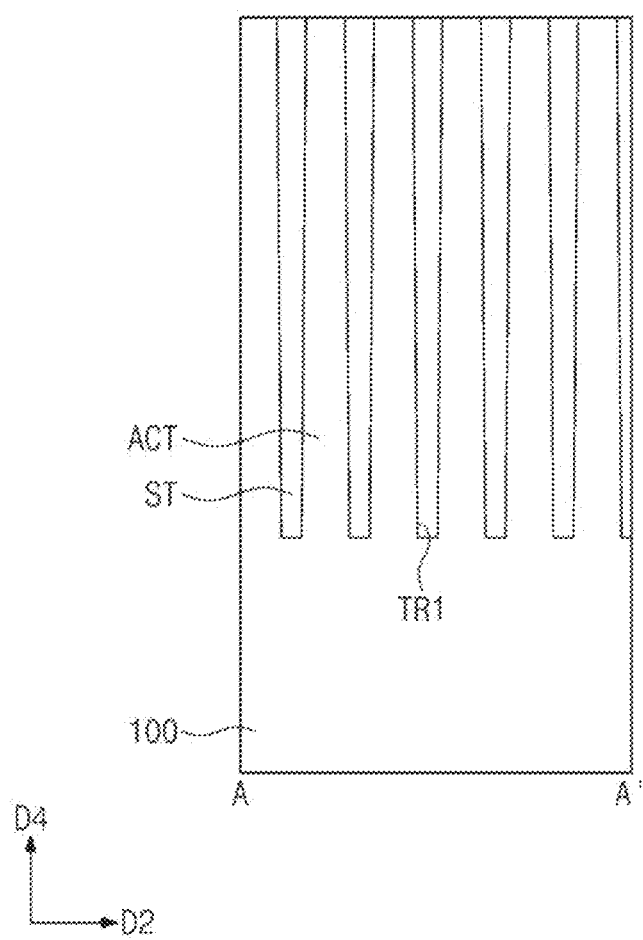
FIGS. 6A, 8A, 10A, 12A, 14A, 16A, and 18A are sectional views taken along lines A-A' of FIGS. 5, 7, 9, 11, 13, 15, and 17, respectively.
Figure 6B:
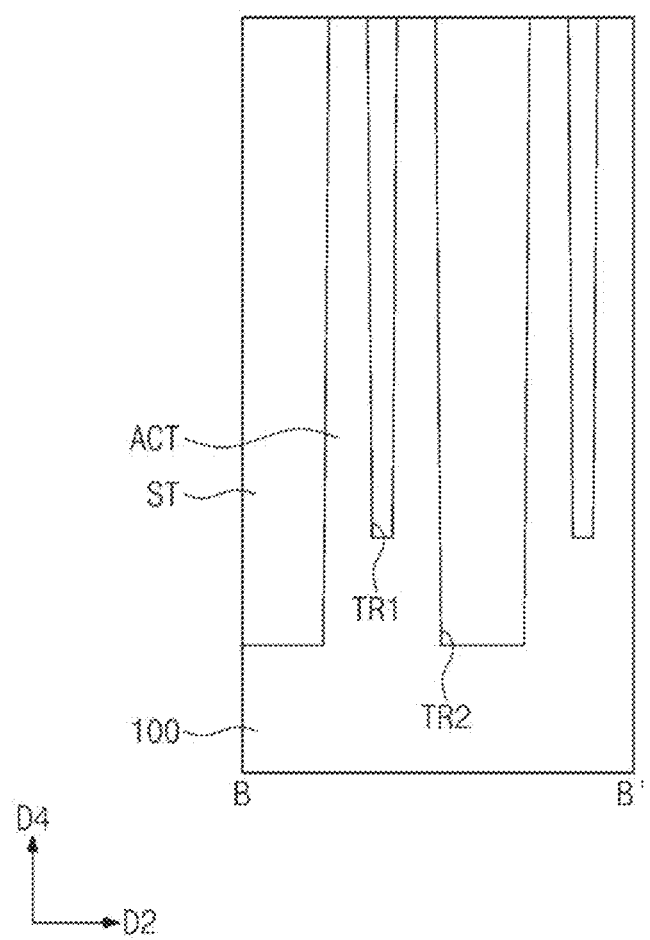
FIGS. 6B, 8B, 10B, 12B, 14B, 16B, and 18B are sectional views taken along lines B-B' of FIGS. 5, 7, 9, 11, 13, 15, and 17, respectively.
Figure 6C:
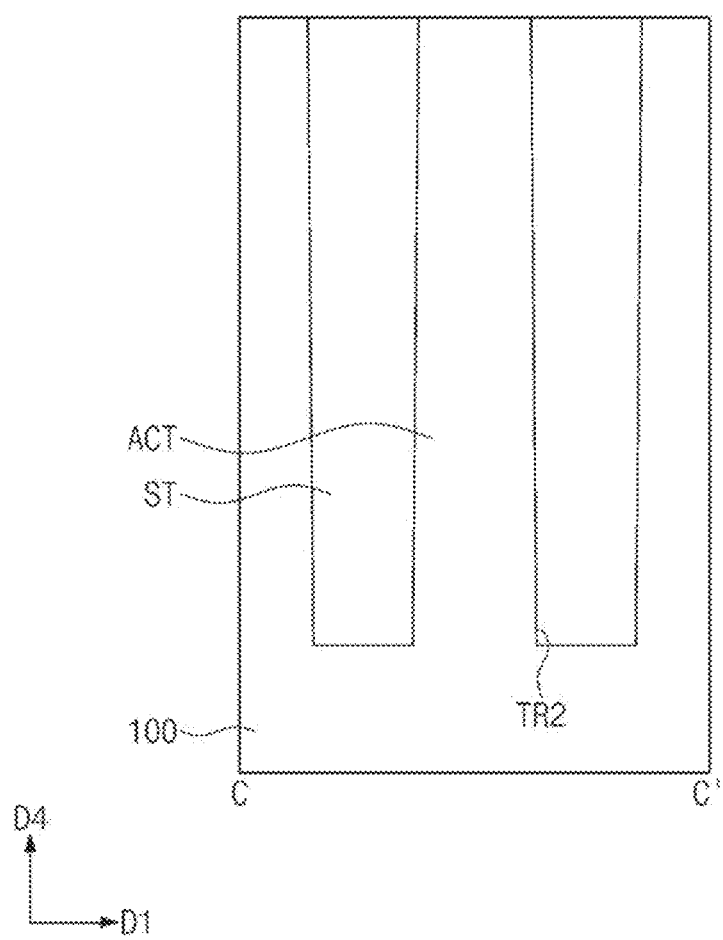
FIGS. 6C, 8C, 10C, 12C, 14C, 16C, and 18C are sectional views taken along lines C-C' of FIGS. 5, 7, 9, 11, 13, 15, and 17, respectively.
Figure 6D:
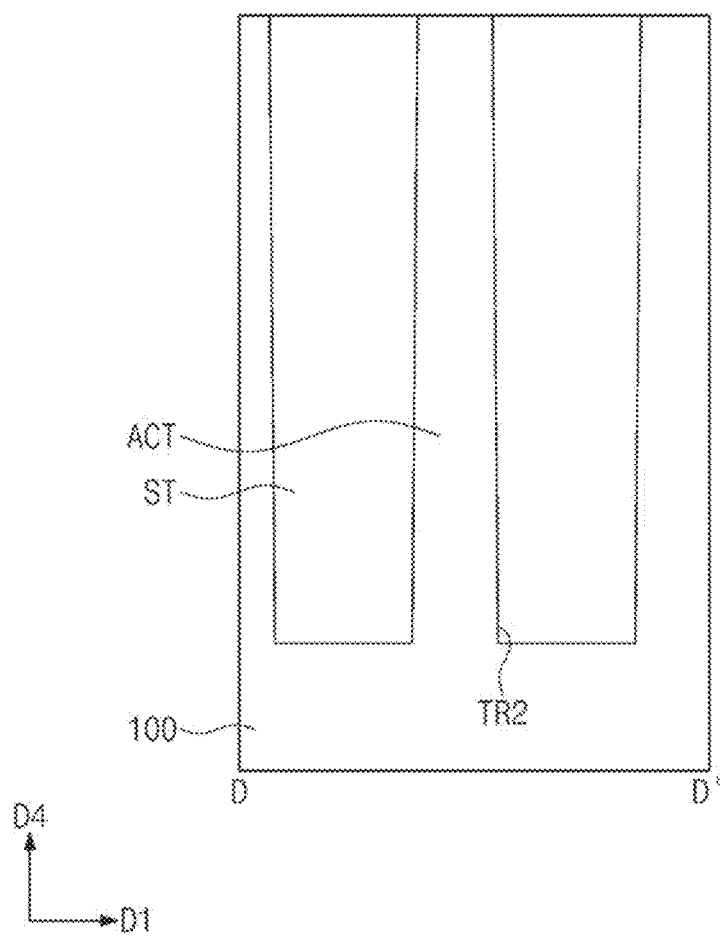
FIGS. 6D, 8D, 10D, 12D, 14D, 16D, and 18D are sectional views taken along lines D-D' of FIGS. 5, 7, 9, 11, 13, 15, and 17, respectively.
Figure 7:
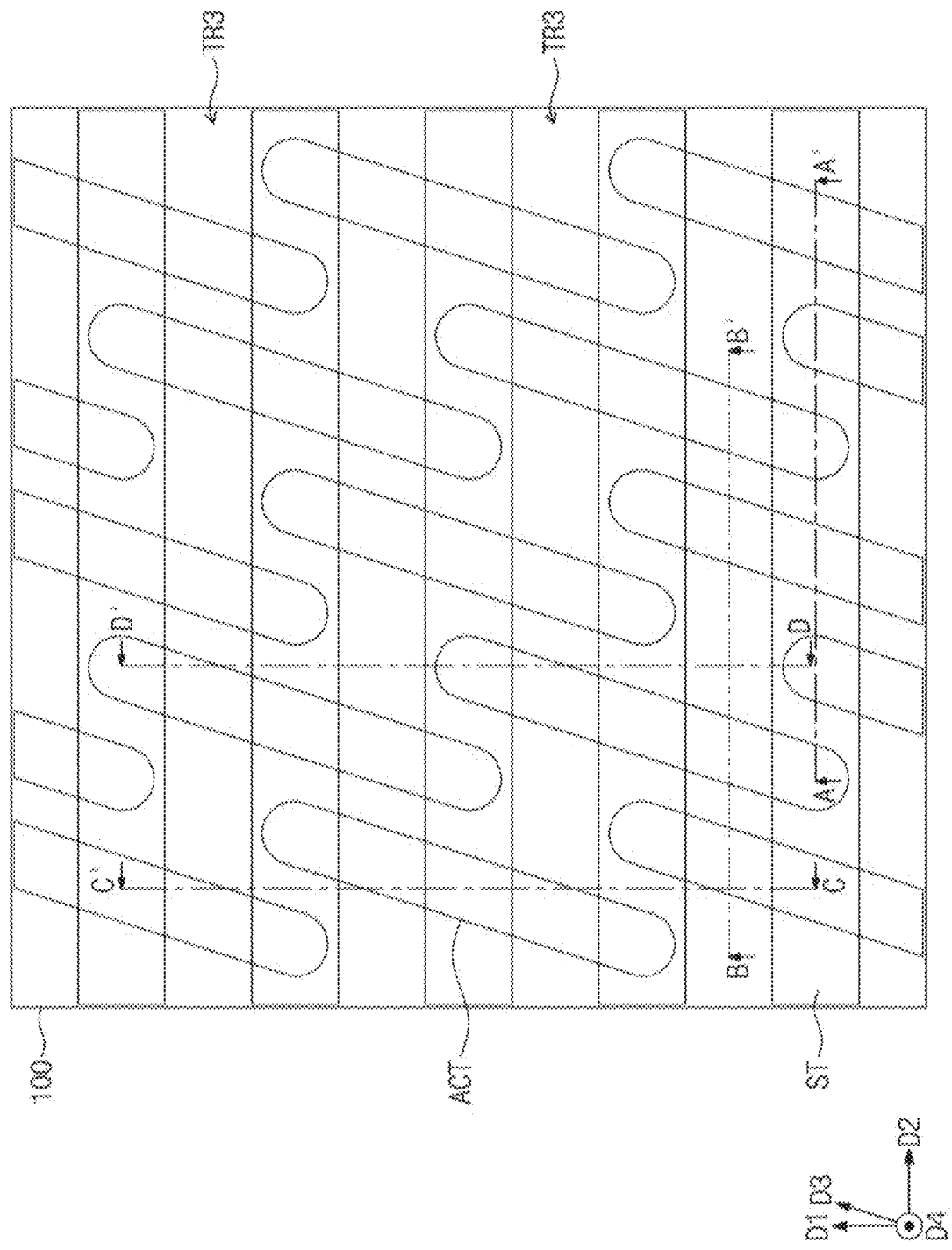
Figure 8A:
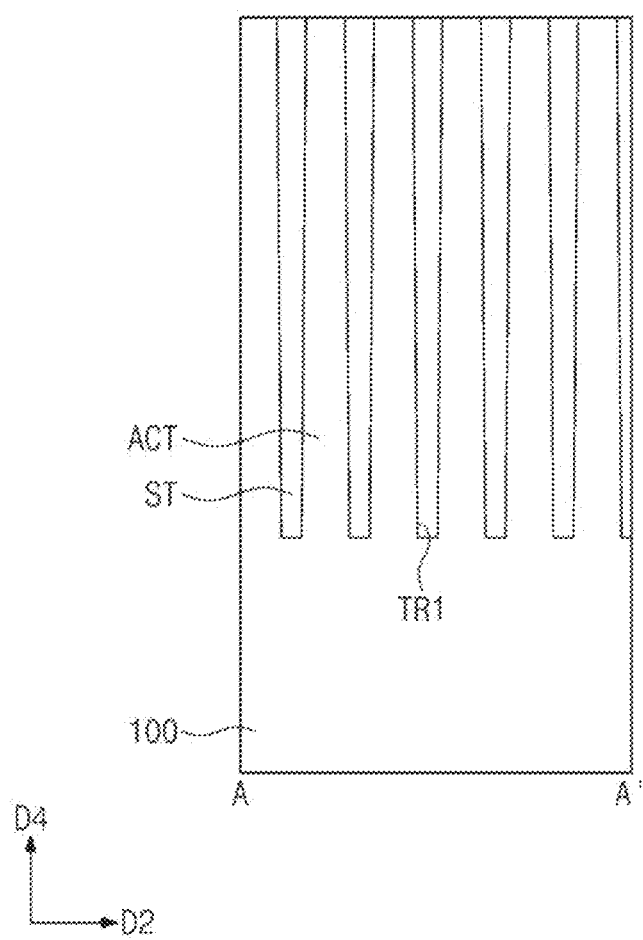
Figure 8B:
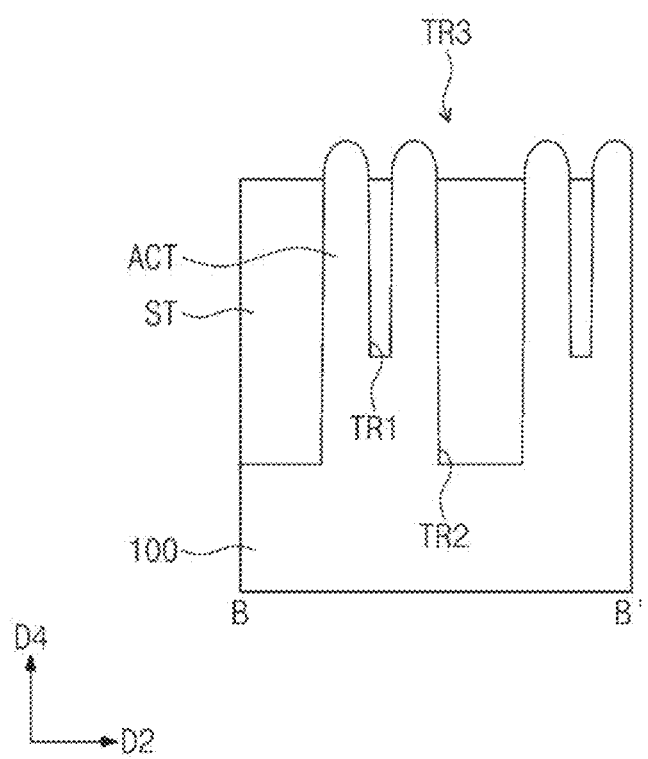
Figure 8C:
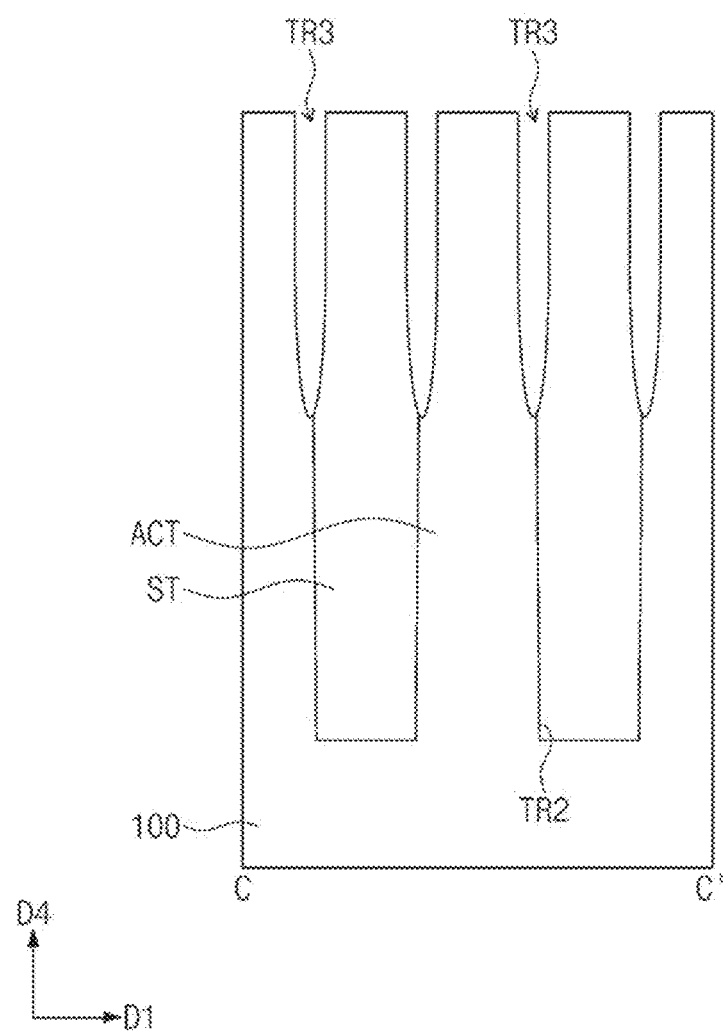
Figure 8D:
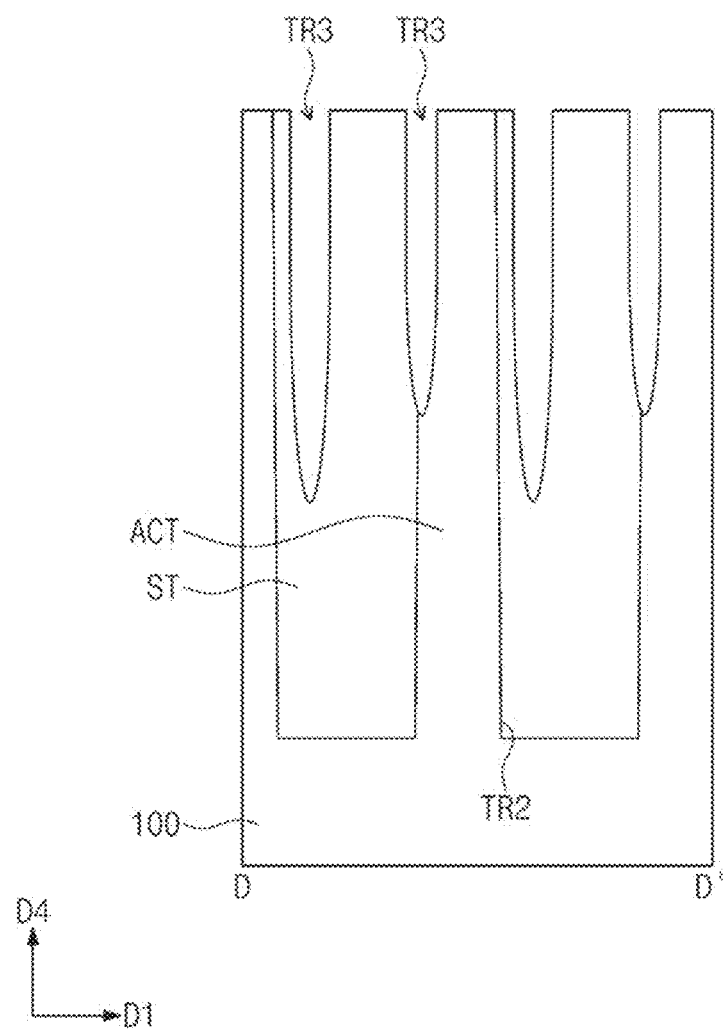
Figure 9:
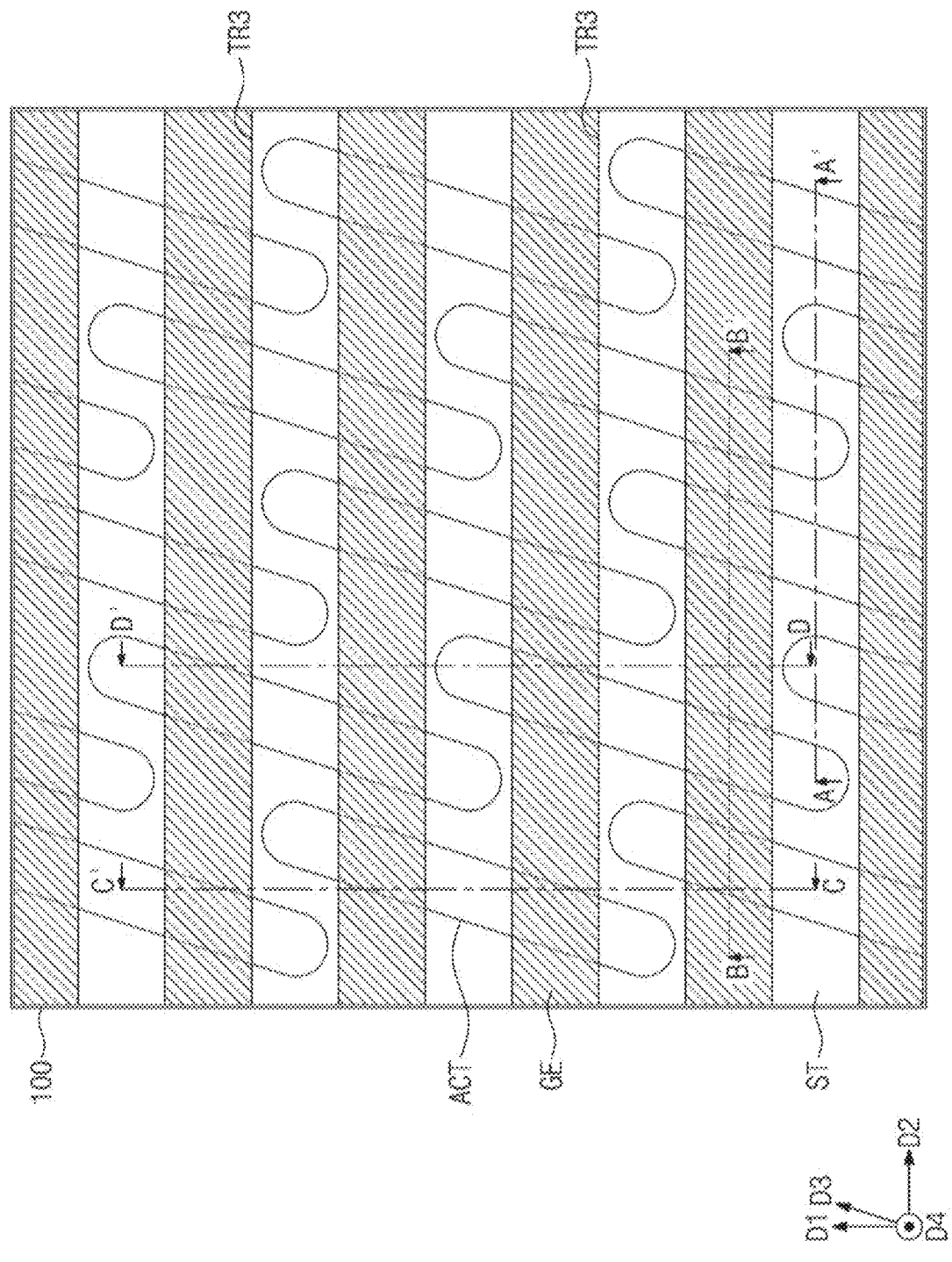
Figure 10A:
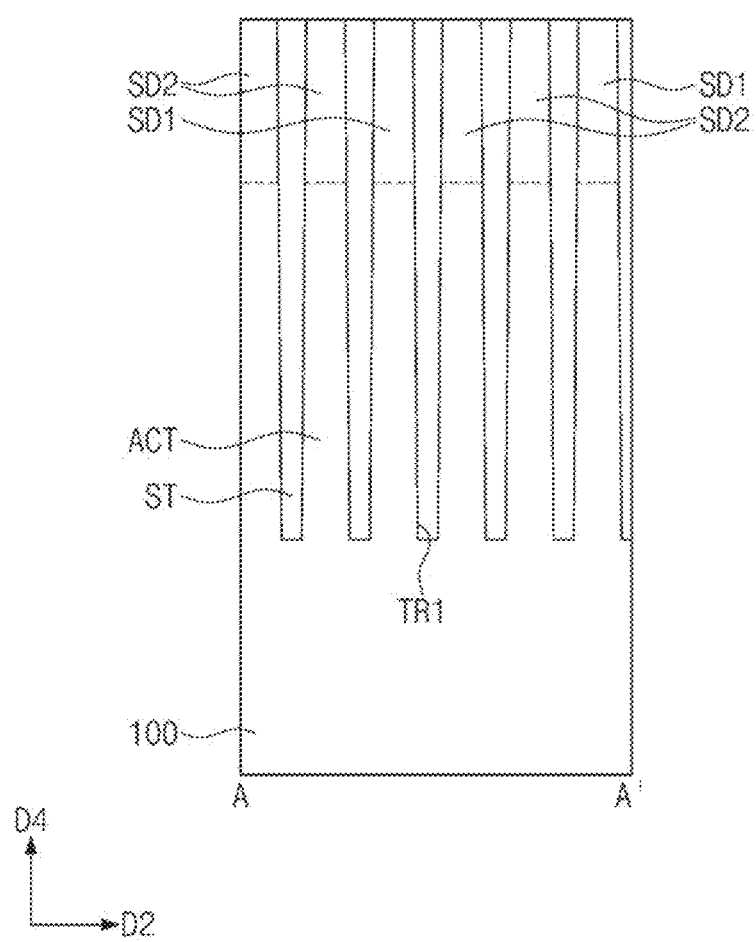
Figure 10B:
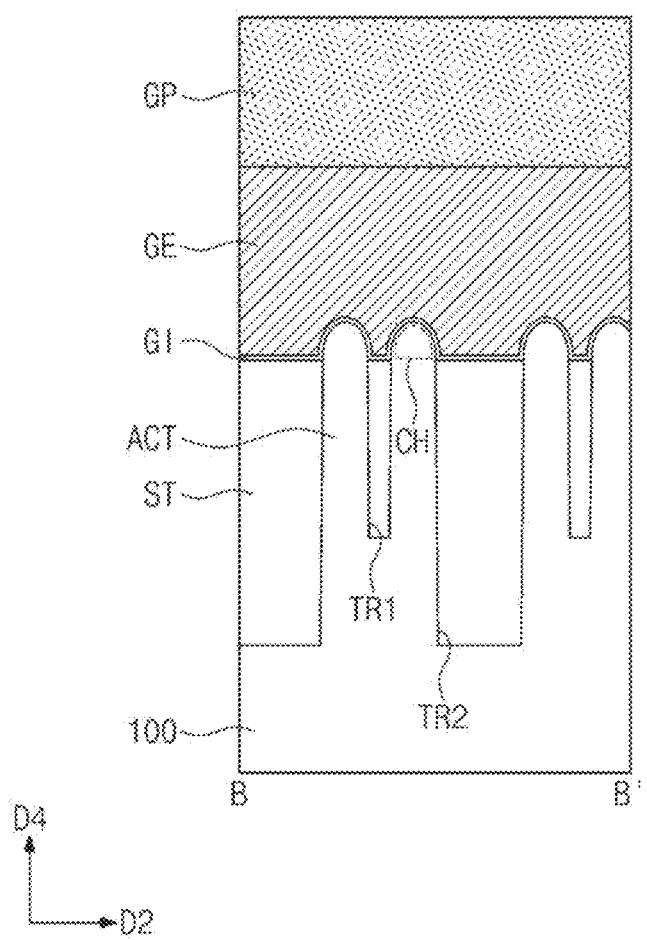
Figure 10C:
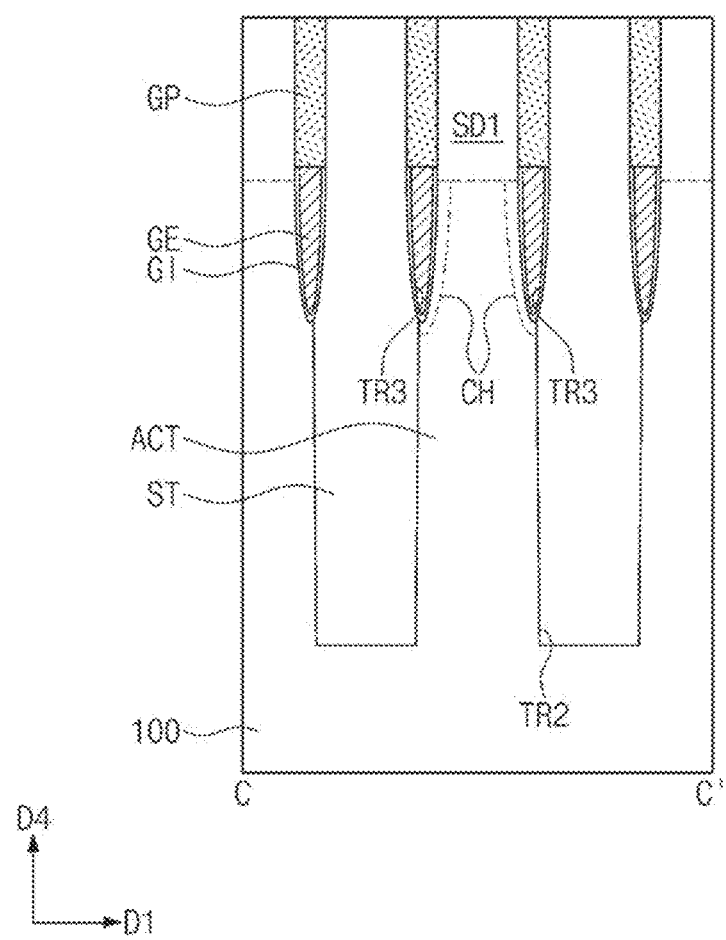
Figure 10D:
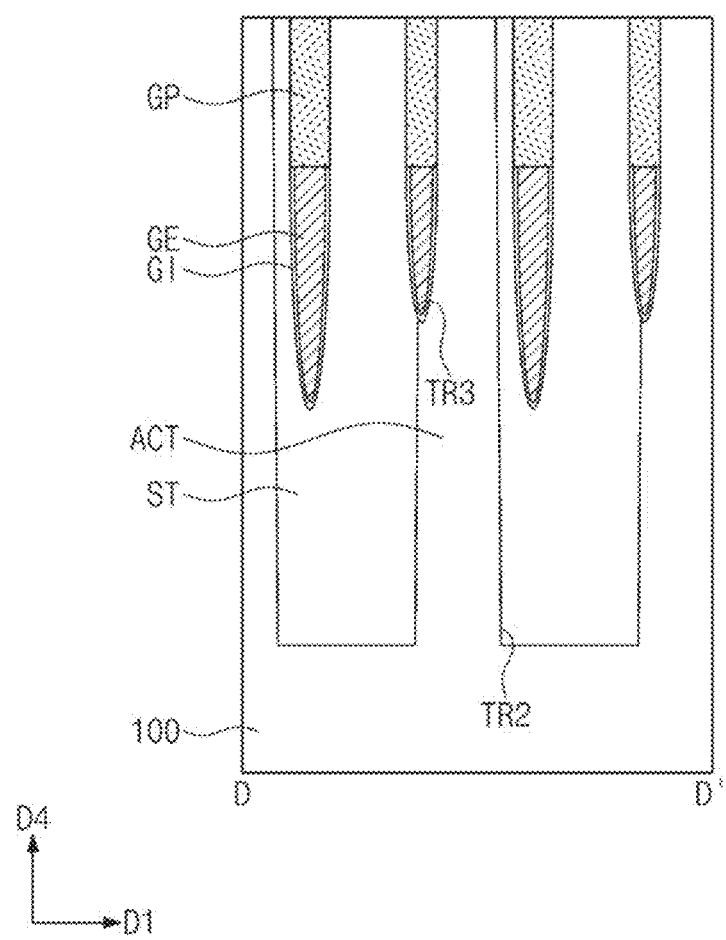
Figure 11:
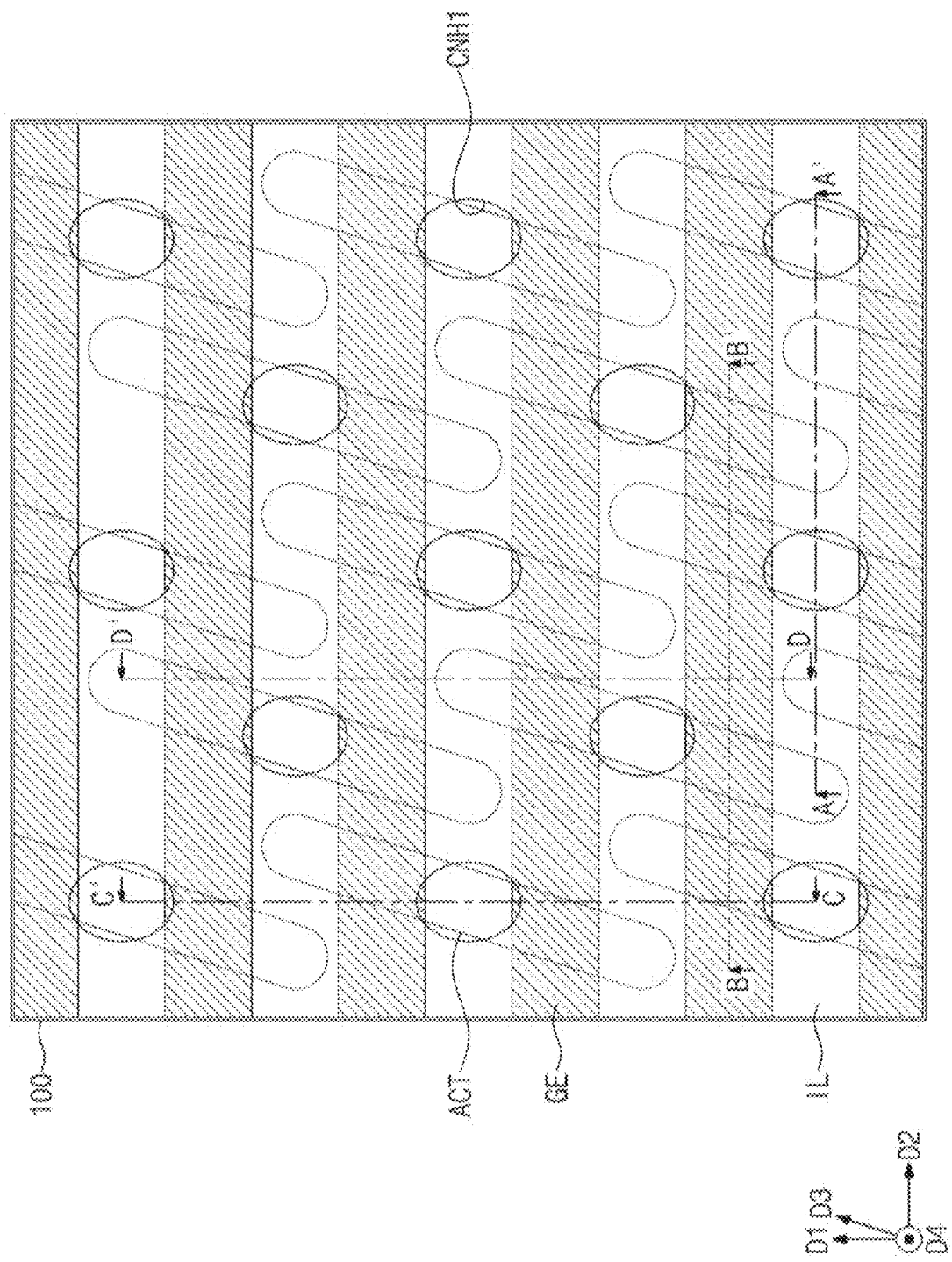
Figure 12A:
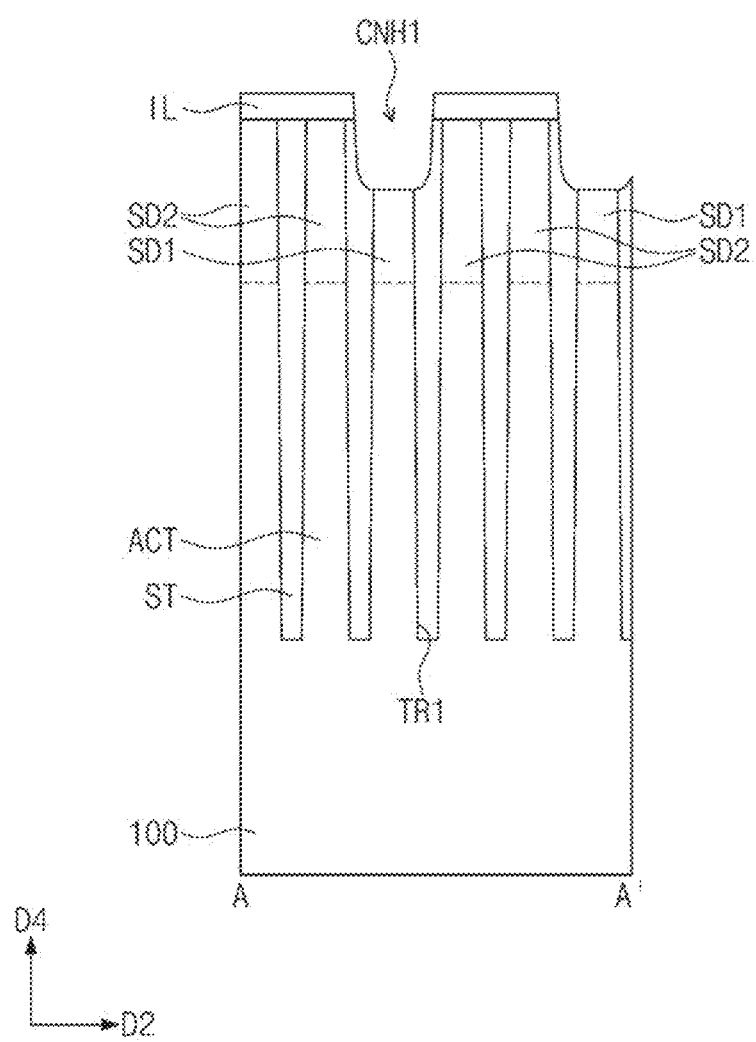
Figure 12B:
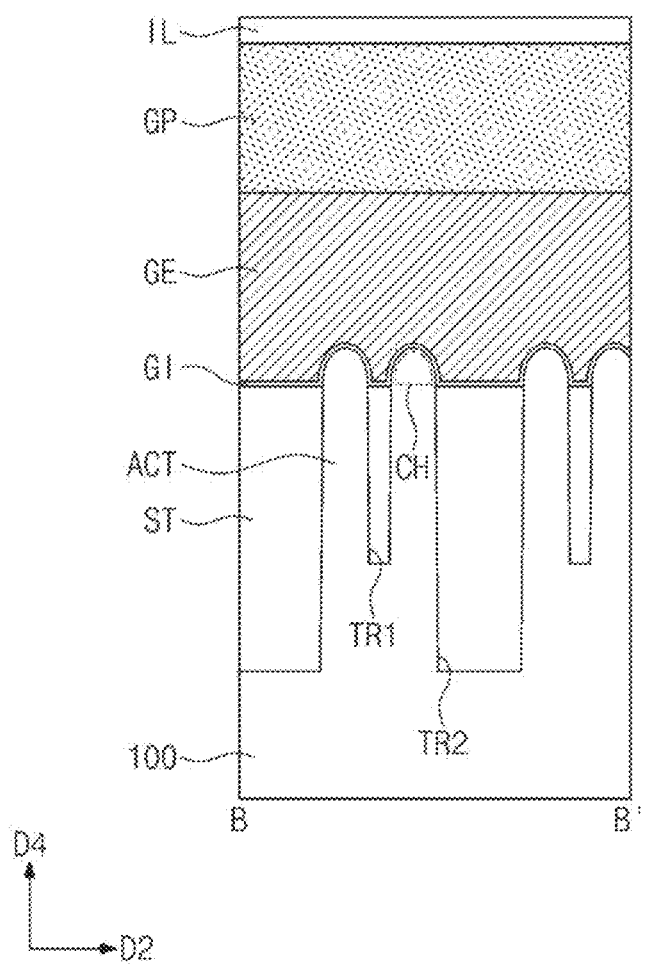
Figure 12C:
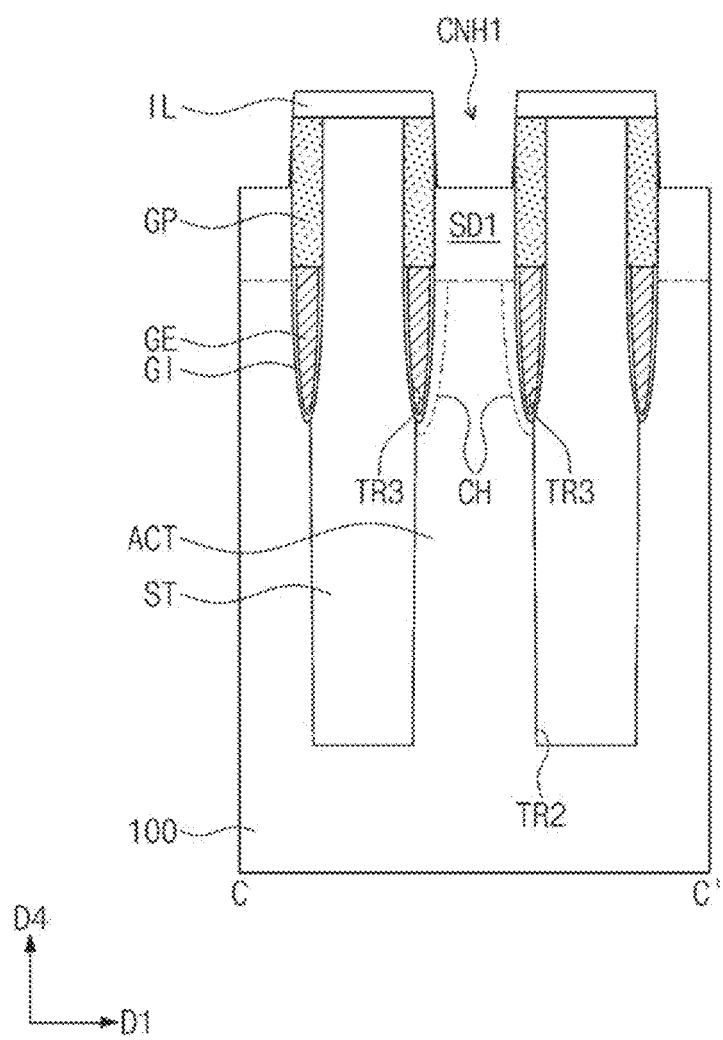
Figure 12D:
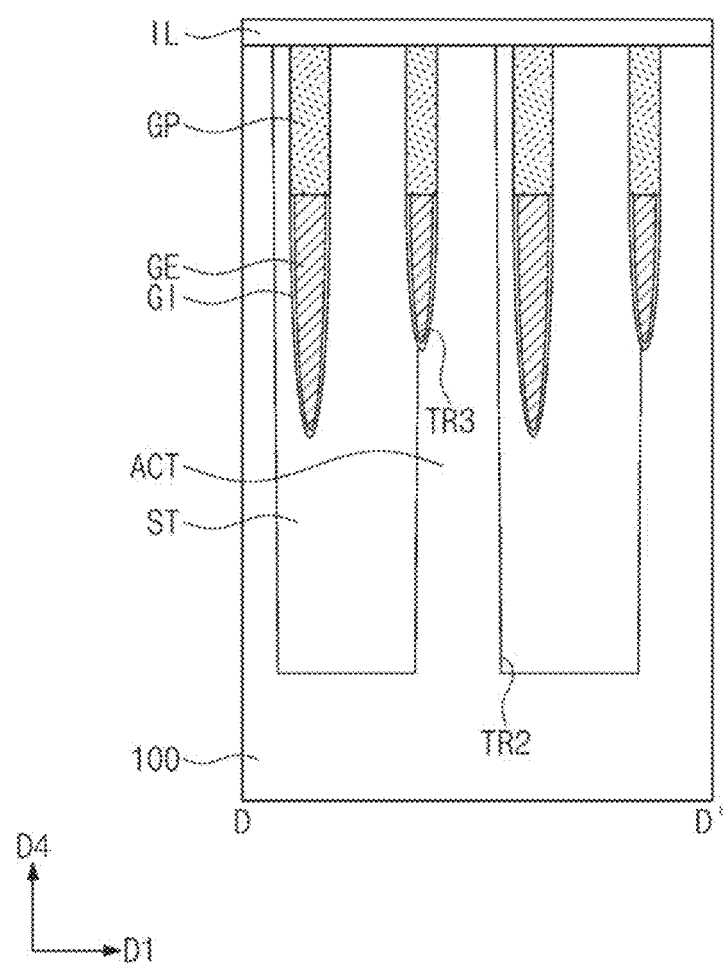
Figure 13:
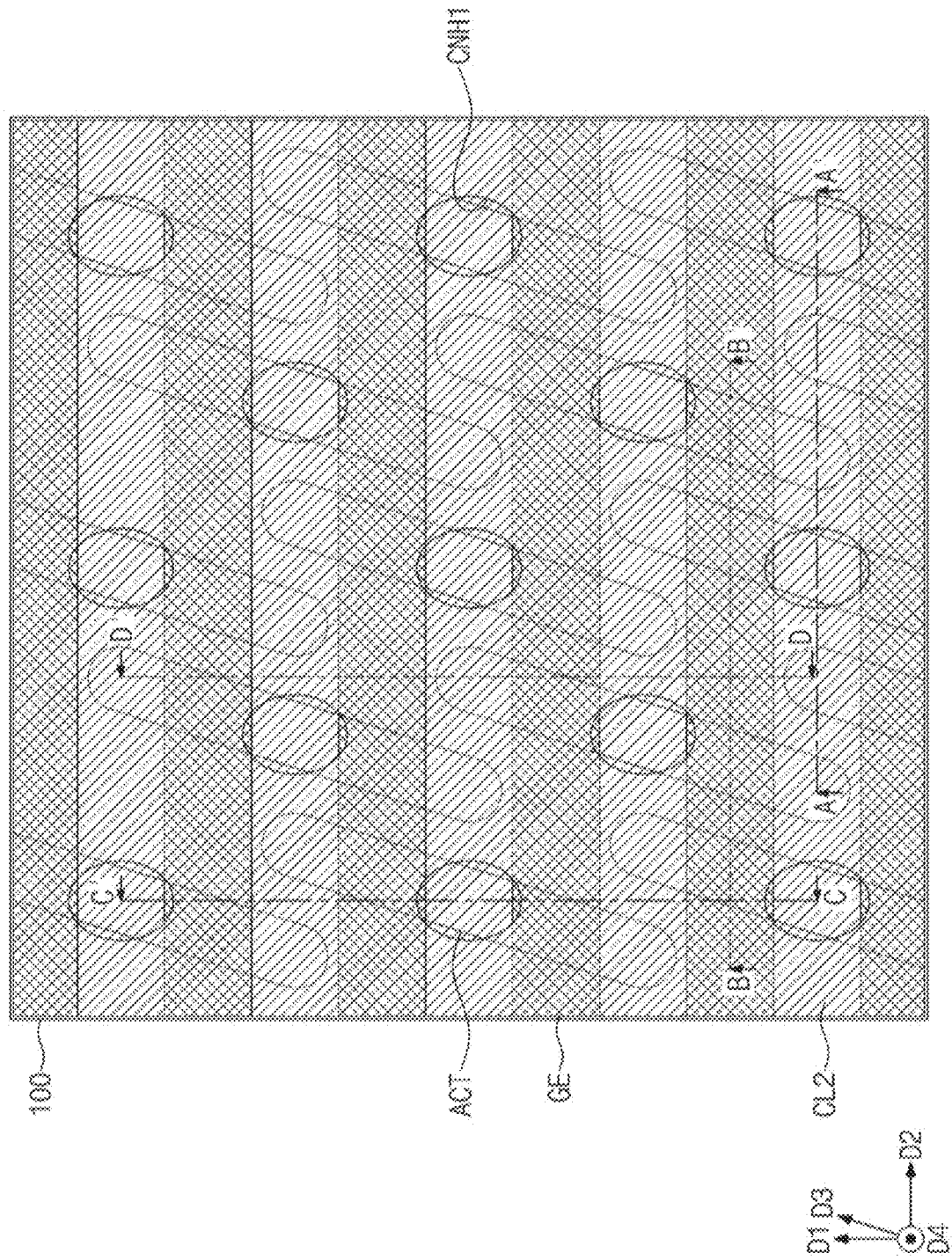
Figure 14A:
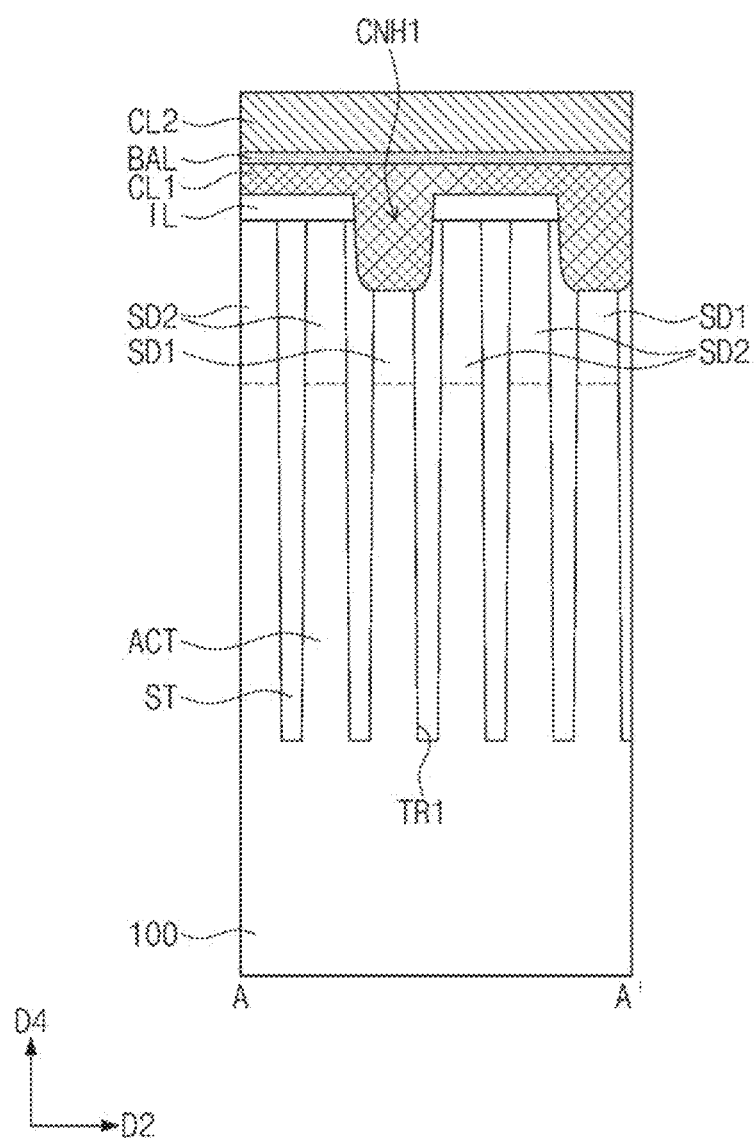
Figure 14B:
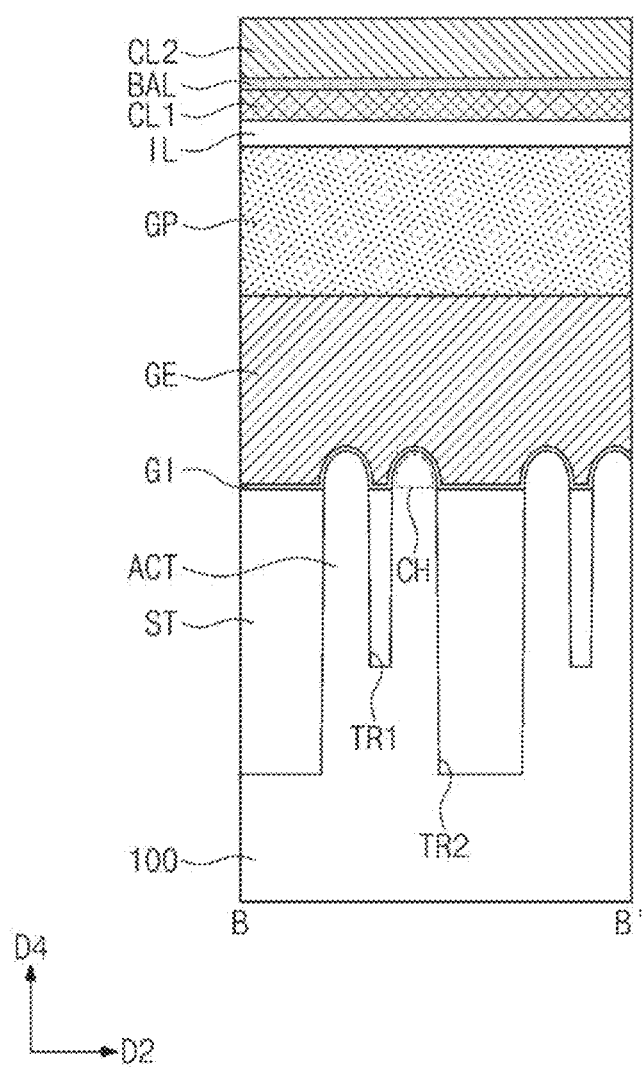
Figure 14C:
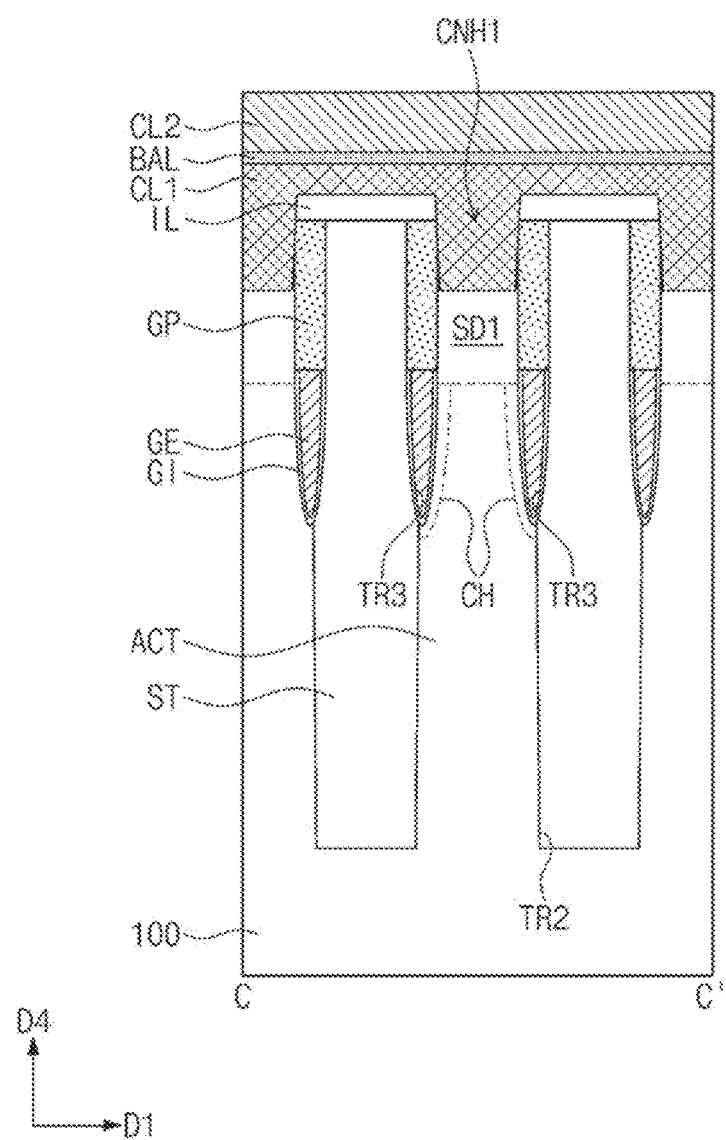
Figure 14D:
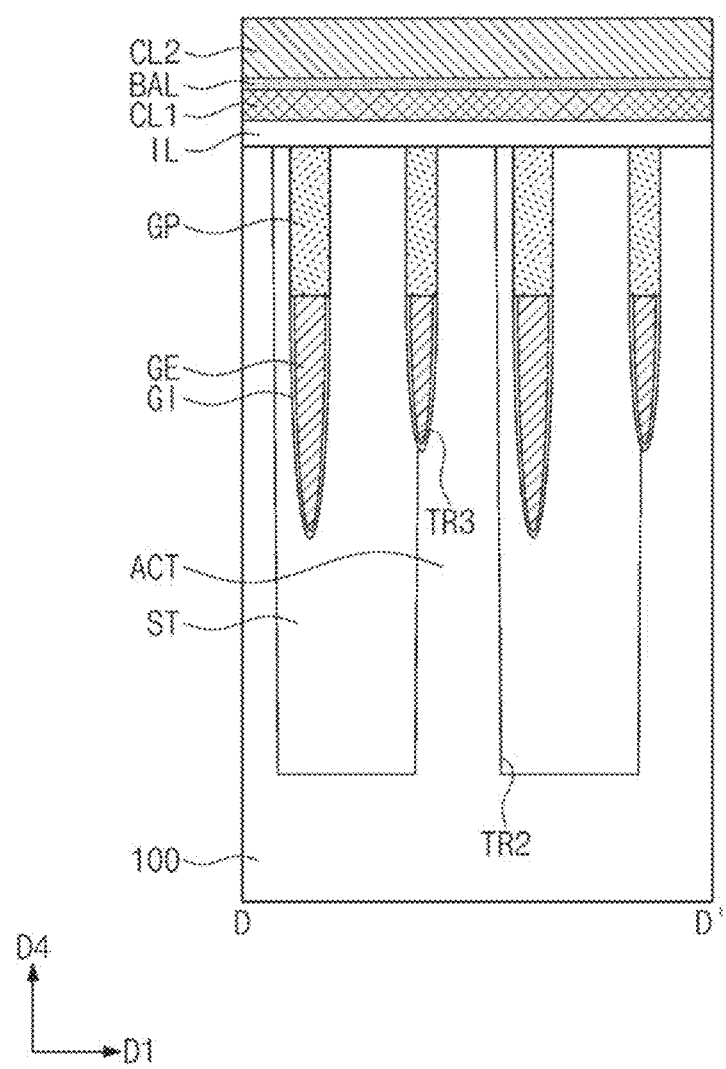
Figure 15:
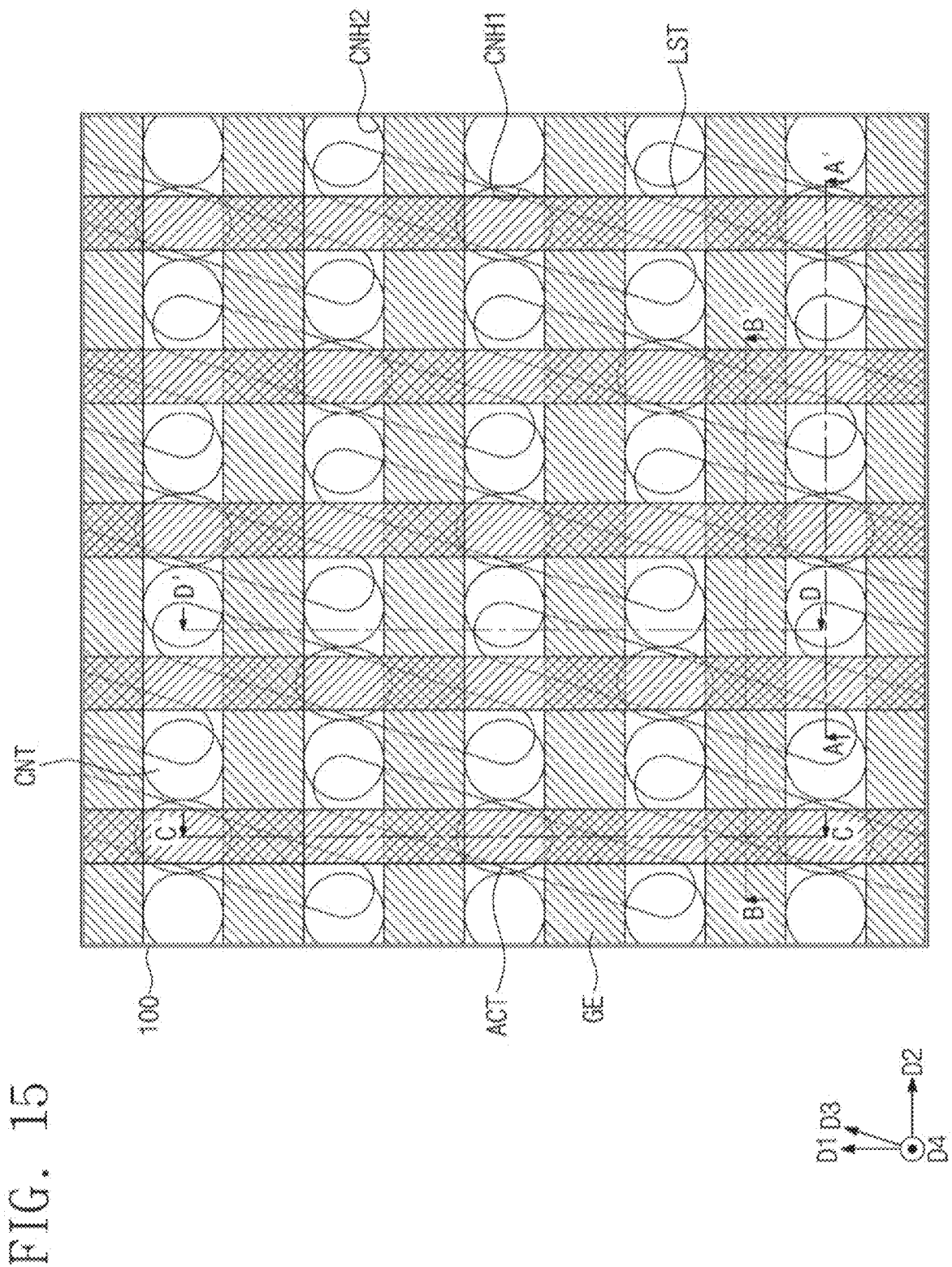
Figure 16A:
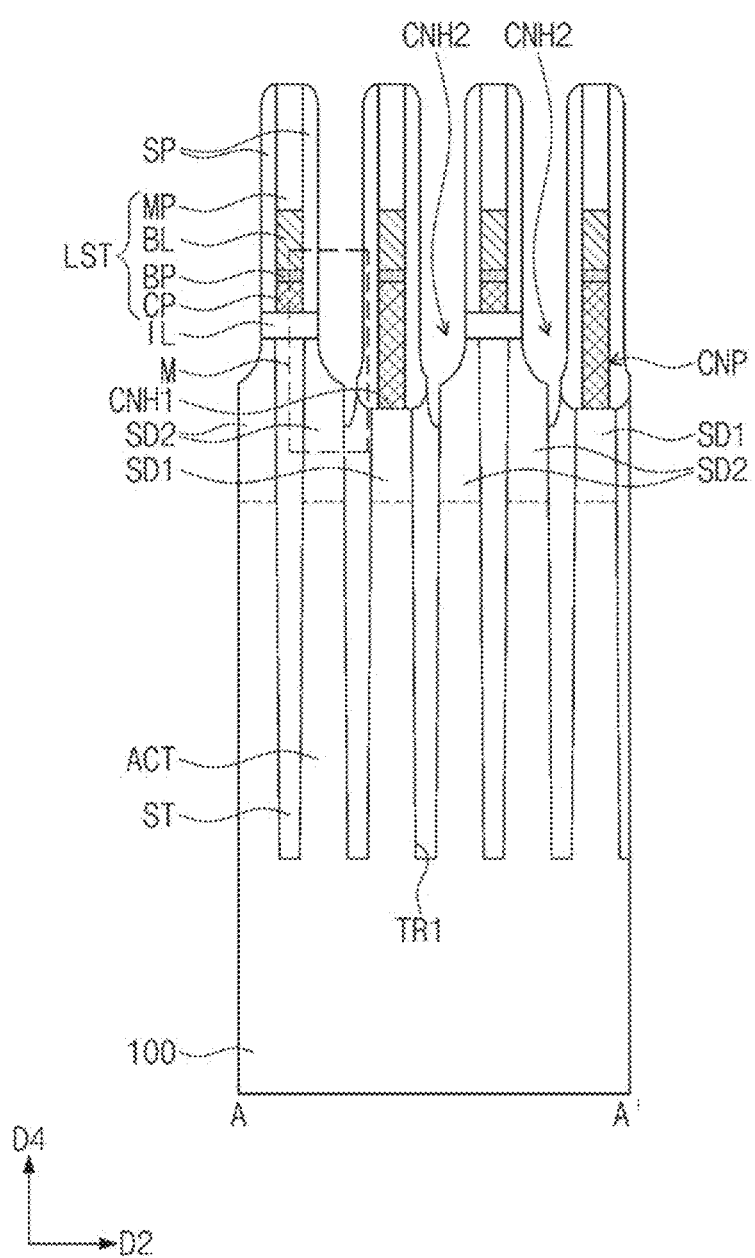
Figure 16B:
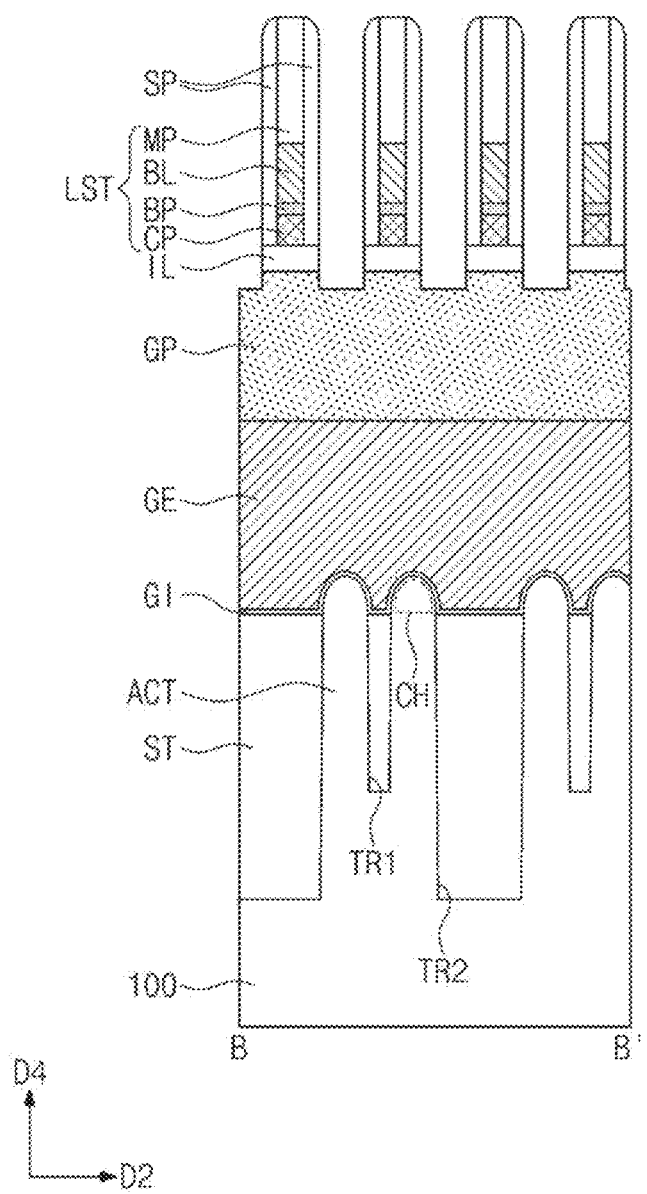
Figure 16C:
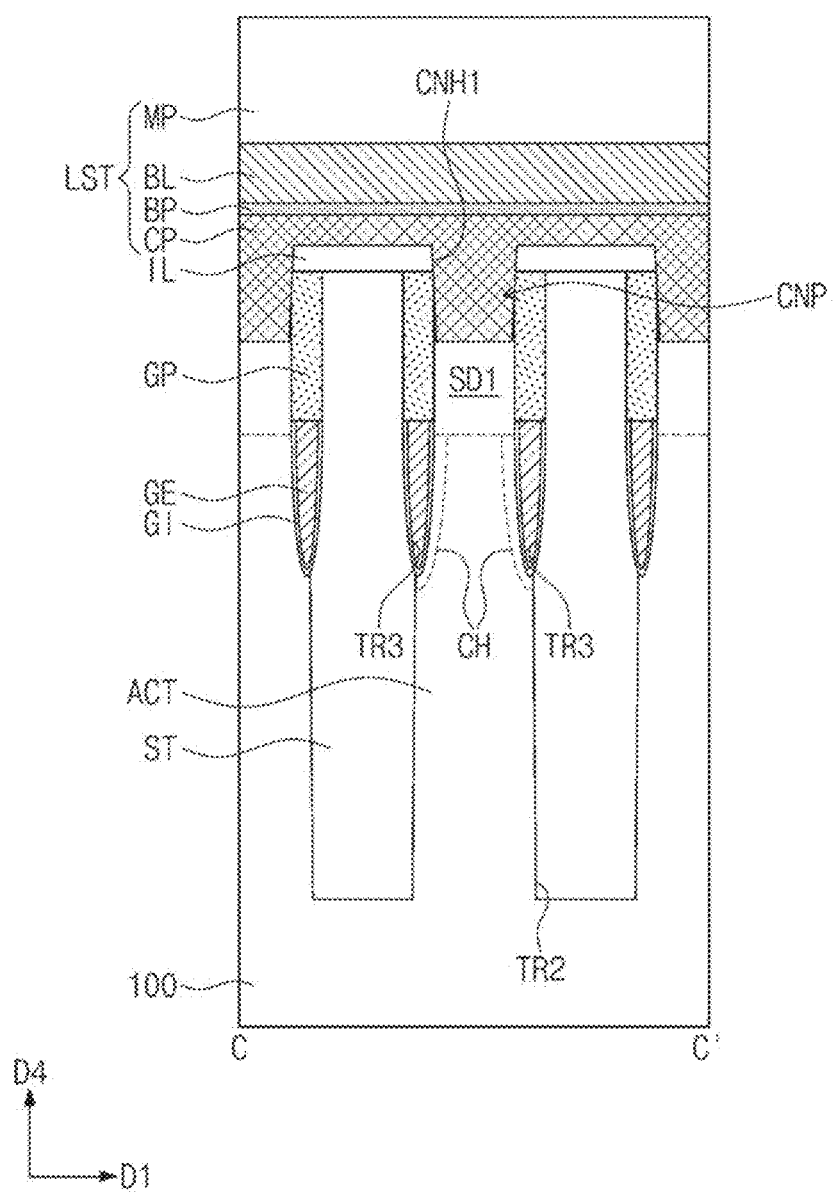
Figure 16D:
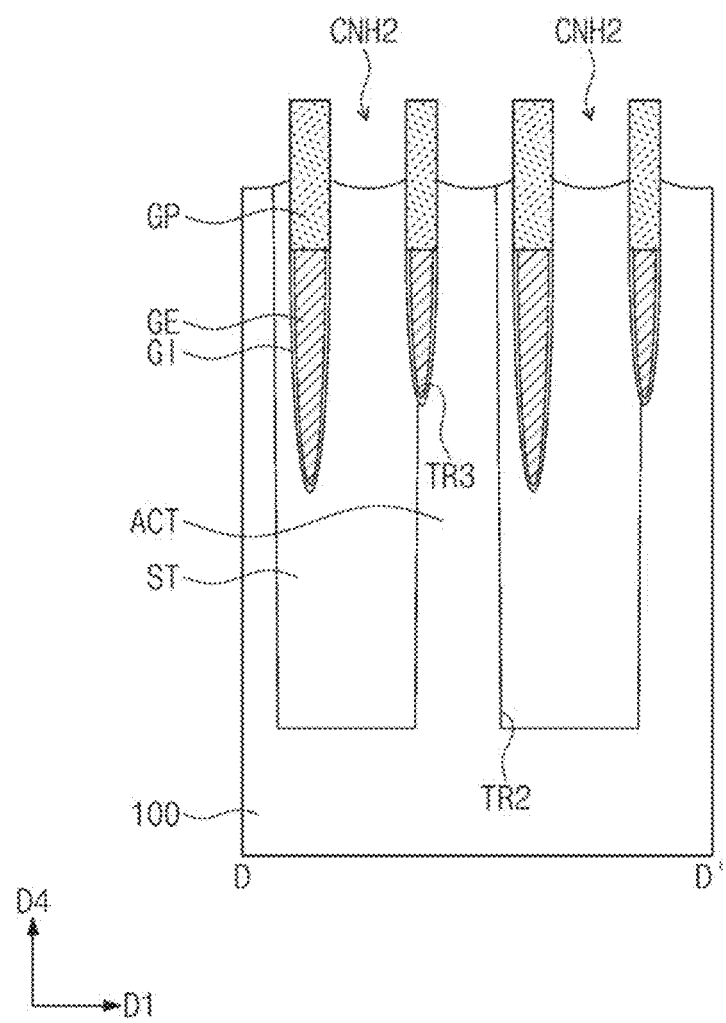
Figure 17:
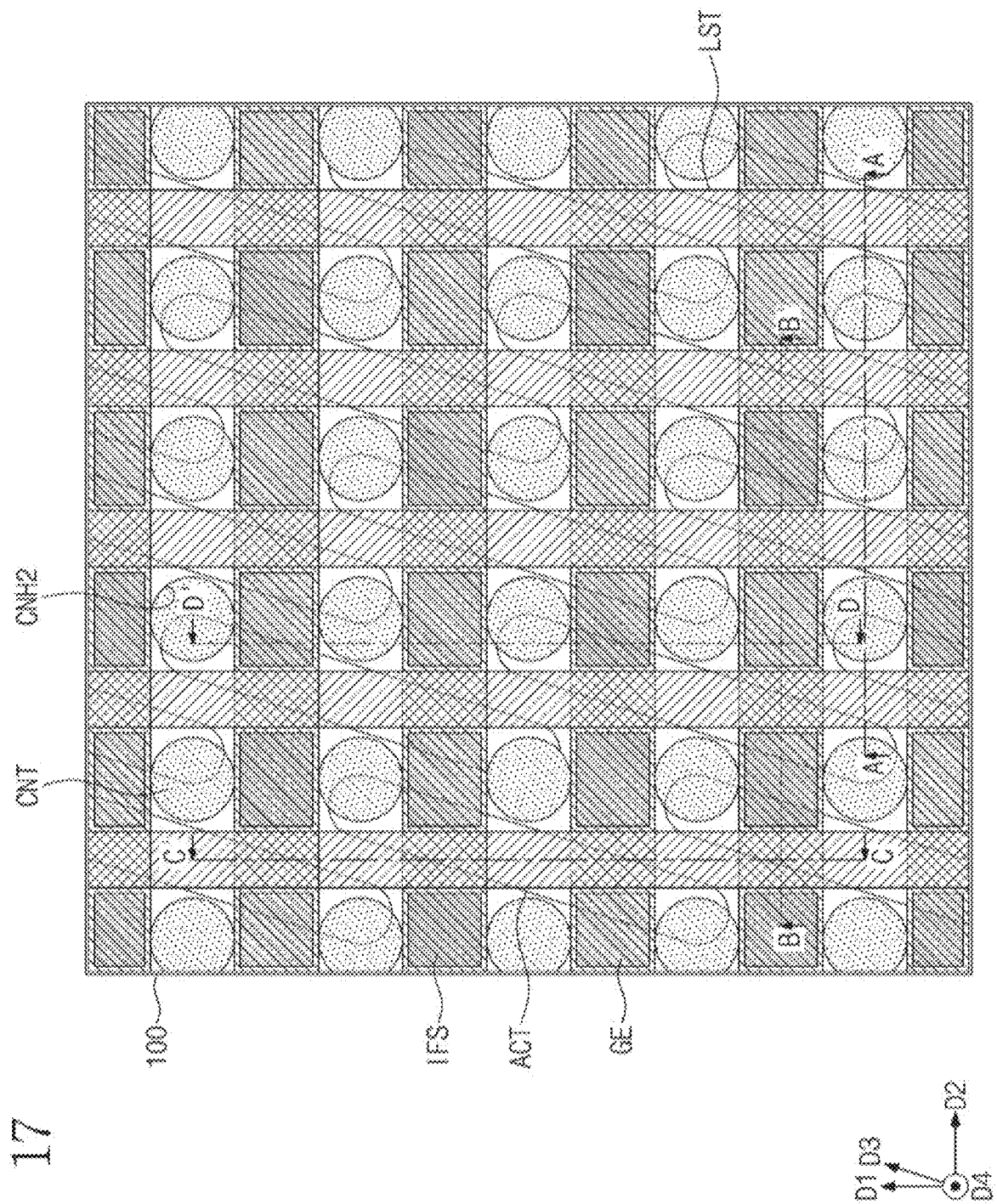
Figure 18A:
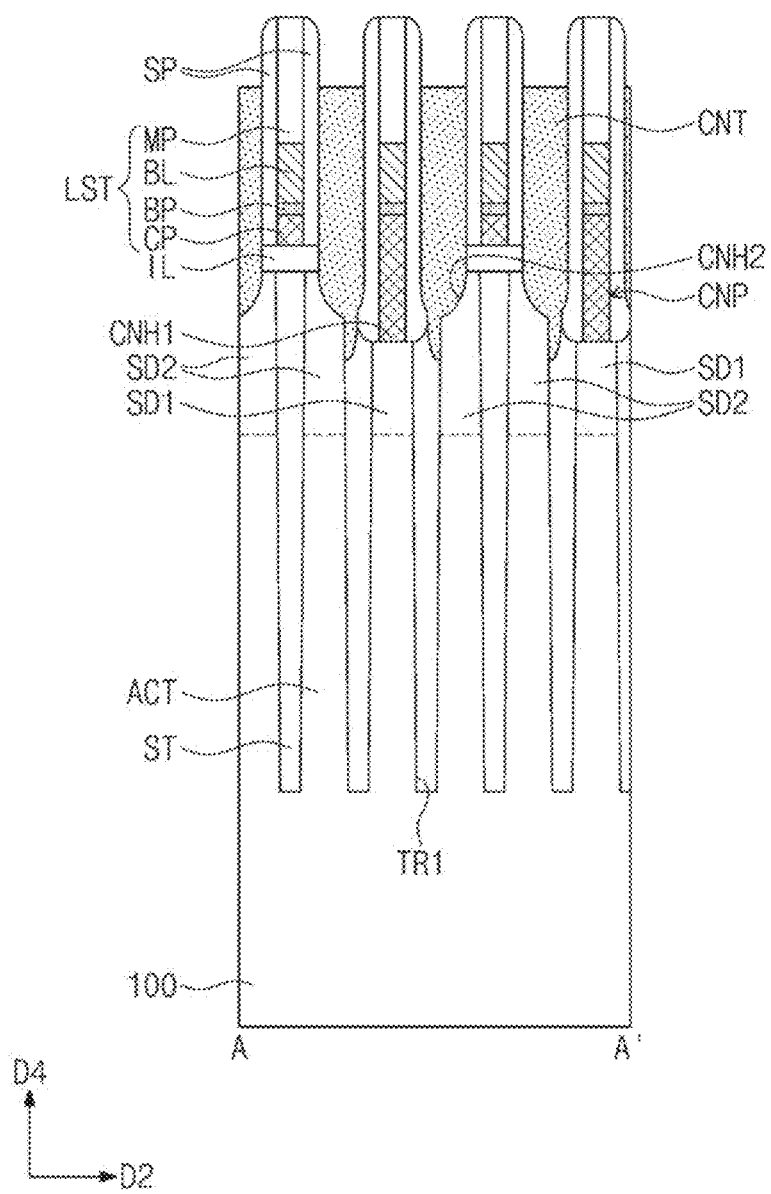
Figure 18B:
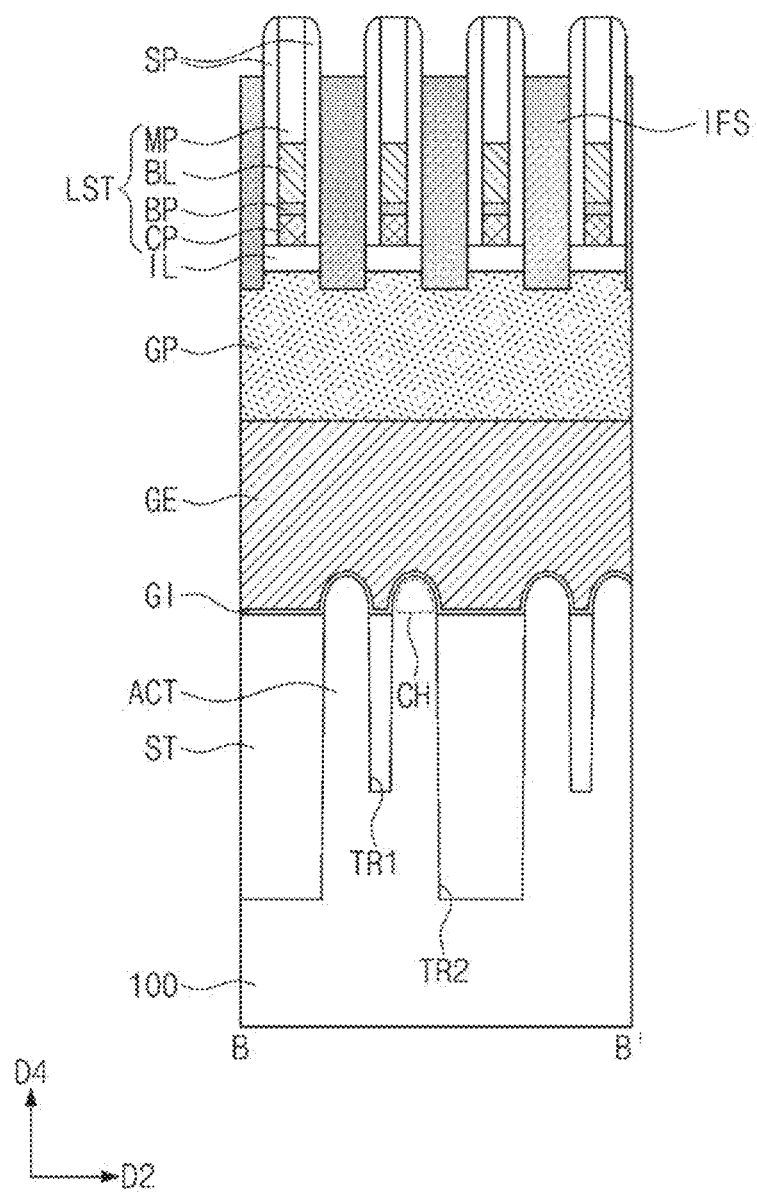
Figure 18C:
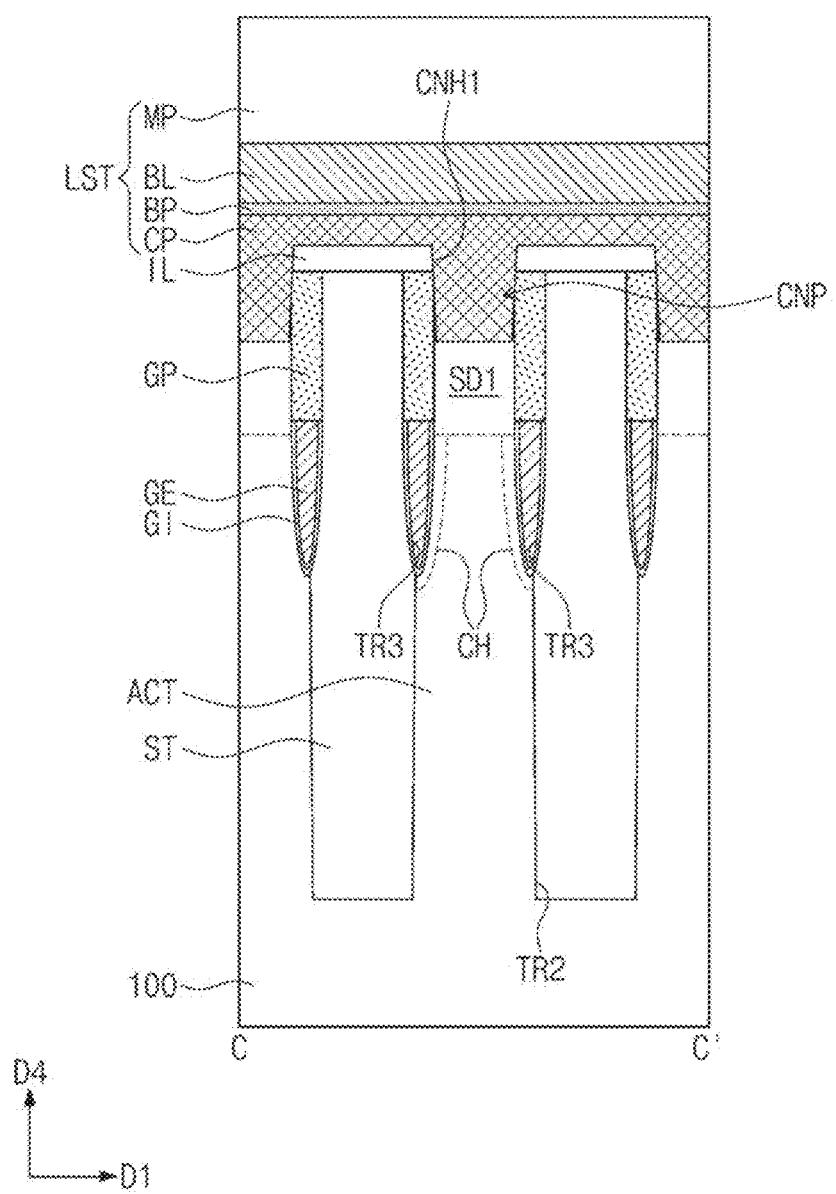
Figure 18D:
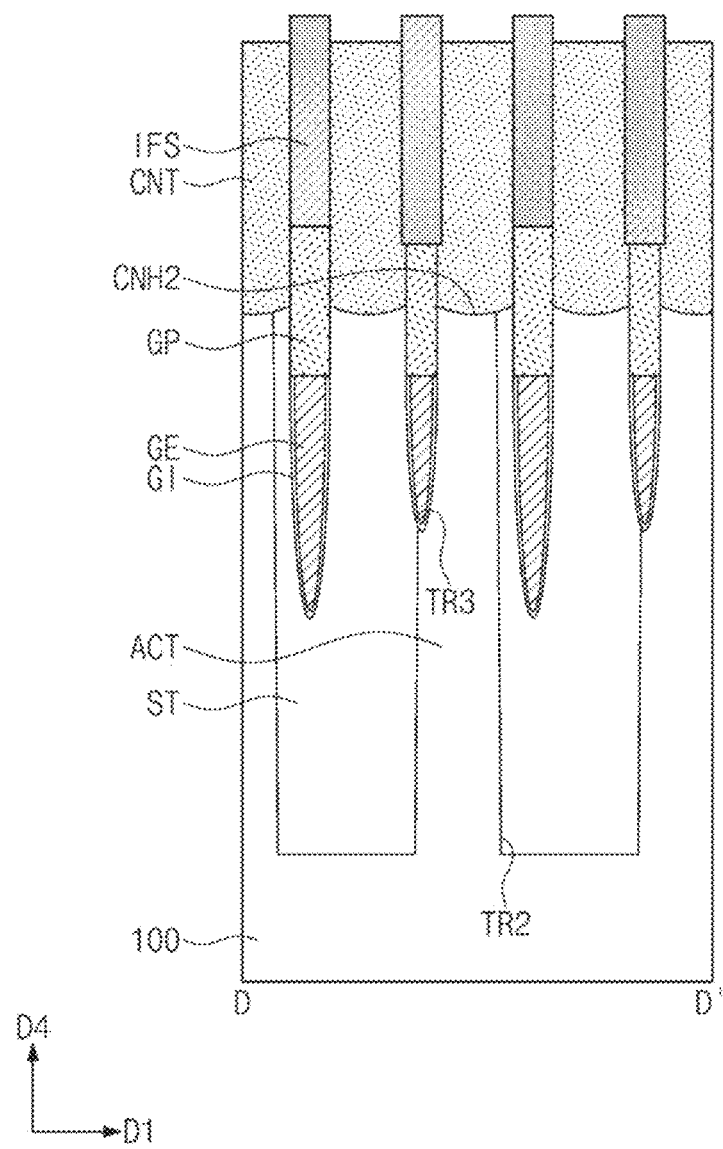

FIG. 4 is a sectional view illustrating another example of the first contact of FIG. 3. For concise description, an element previously described with reference to FIGS. 1 to 3 may be identified by the same reference number without repeating an overlapping description thereof.

Referring to FIG. 4, the first contact CNT1 may include the lower portion LWP in the second contact hole CNH2 and the upper portion UPP on the lower portion LWP. The first contact CNT1 according to the present embodiment may not include the vertically-extended portion VEP covering the upper side surface USW of the active pattern ACT. The lower portion LWP of the first contact CNT1 may cover the recessed top surface RTS of the second source/drain region SD2.

A width W of the lower portion LWP of the first contact CNT1 in the second direction D2 may decrease with decreasing distance from the bottom of the substrate 100. The width W of the lower portion LWP may be abruptly decreased, due to the presence of the second spacer SP2. At least a portion of the lower portion LWP may be provided in a recessed upper portion of the device isolation layer ST and may be in contact with the device isolation layer ST.

Figure 19:
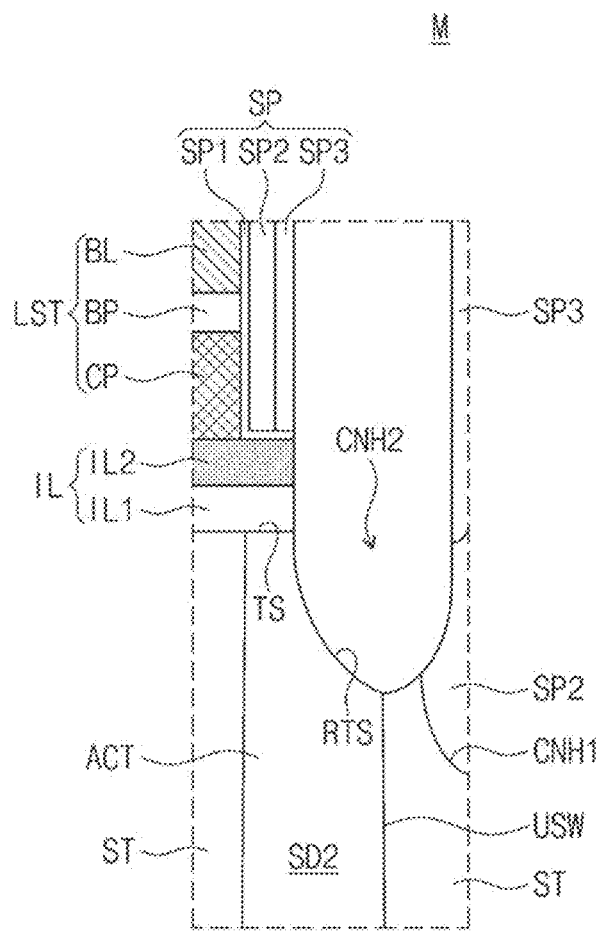
FIGS. 19 and 20 are enlarged sectional views, each of which illustrates a region M of FIG. 16A.
Figure 20:
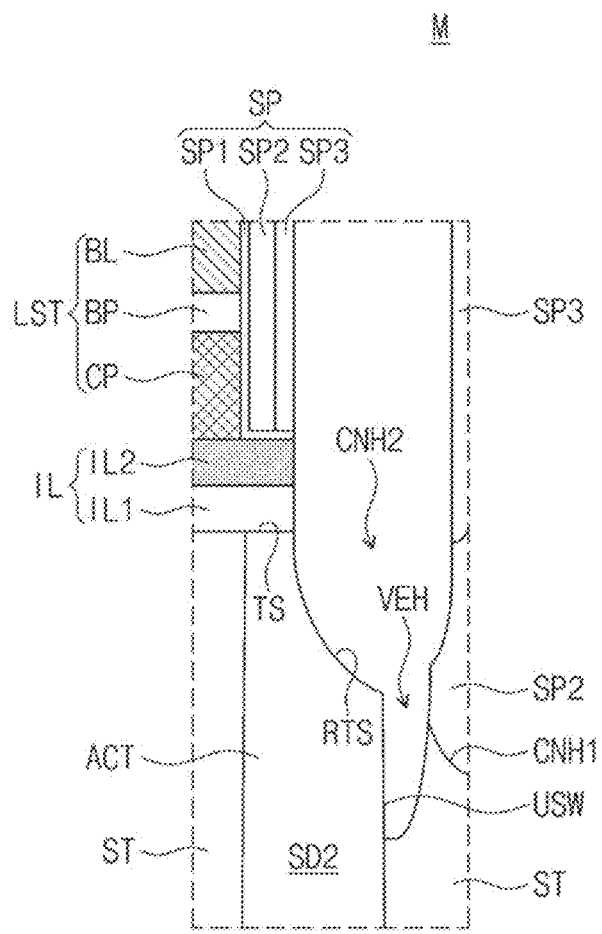

FIGS. 5, 7, 9, 11, 13, 15, and 17 are plan views illustrating a method of fabricating a semiconductor device, according to an embodiment of the inventive concept. FIGS. 6A, 8A, 10A, 12A, 14A, 16A, and 18A are sectional views taken along lines A-A' of FIGS. 5, 7, 9, 11, 13, 15, and 17, respectively. FIGS. 6B, 8B, 10B, 12B, 14B, 16B, and 18B are sectional views taken along lines B-B' of FIGS. 5, 7, 9, 11, 13, 15, and 17, respectively. FIGS. 6C, 8C, 10C, 12C, 14C, 16C, and 18C are sectional views taken along lines C-C' of FIGS. 5, 7, 9, 11, 13, 15, and 17, respectively. FIGS. 6D, 8D, 10D, 12D, 14D, 16D, and 18D are sectional views taken along lines D-D' of FIGS. 5, 7, 9, 11, 13, 15, and 17, respectively. FIGS. 19 and 20 are enlarged sectional views, each of which illustrates a region M of FIG. 16A.

Referring to FIGS. 5 and 6A to 6D, the active patterns ACT may be formed by patterning an upper portion of the substrate 100. Each of the active patterns ACT may be extended in the third direction D3 that is parallel to the top surface of the substrate 100. The active patterns ACT may be two-dimensionally arranged in the first direction D1 and the second direction D2. The active patterns ACT may be spaced apart from each other in the third direction D3.

The first and second trenches TR1 and TR2 may be defined between the active patterns ACT. The first trench TR1 may be defined between a pair of active patterns ACT, which are adjacent to each other in the second direction D2. The second trench TR2 may be defined between a pair of active patterns ACT, which are adjacent to each other in the third direction D3.

The device isolation layer ST may be formed in (e.g., to fill) the first and second trenches TR1 and TR2. The device isolation layer ST may be formed to completely fill the first and second trenches TR1 and TR2 and to cover the active patterns ACT. A planarization process may be performed on the device isolation layer ST to expose the top surfaces of the active patterns ACT.

Referring to FIGS. 7 and 8A to 8D, the third trenches TR3 may be formed by patterning the active patterns ACT and the device isolation layer ST. When viewed in a plan view, each of the third trenches TR3 may have a line shape extending in the second direction D2.

The formation of the third trenches TR3 may include forming a hard mask pattern with openings and etching the exposed portions of the active patterns ACT and the device isolation layer ST using the hard mask pattern as an etch mask. The third trench TR3 may be formed to be shallower than the first trench TR1.

Referring to FIGS. 9 and 10A to 10D, the gate dielectric layer GI, the gate electrode GE, and the gate capping layer GP may be sequentially formed in each of the third trenches TR3. In detail, the gate dielectric layer GI may be conformally formed in the third trench TR3. The gate dielectric layer GI may be formed of or include at least one of silicon oxide, silicon nitride, silicon oxynitride, and/or high-k dielectric materials.

The formation of the gate electrode GE may include forming a conductive layer on the gate dielectric layer GI in (e.g., to fill) the third trench TR3. The conductive layer may be formed of or include at least one of conductive metal nitrides and/or metallic materials.

The gate dielectric layer GI and the gate electrode GE may be recessed, and then, the gate capping layer GP may be formed on the recessed gate electrode GE. The top surface of the gate capping layer GP may be coplanar with the top surface of the active pattern ACT.

An ion implantation process may be performed on the active patterns ACT to form the first source/drain region SD1 and the pair of second source/drain regions SD2 in an upper portion of the active pattern ACT. The pair of second source/drain regions SD2 may be spaced apart from each other in the third direction D3, with the first source/drain region SD1 interposed therebetween. In an embodiment, the first and second source/drain regions SD1 and SD2 may be doped with the same impurities.

The channel region CH may be defined in a portion of the active pattern ACT located below the gate electrode GE. When viewed in a plan view, the channel region CH may be interposed between the first source/drain region SD1 and the second source/drain region SD2. The gate electrode GE may be provided on the top surface and opposite side surfaces of the channel region CH (e.g., see FIG. 10B).

Referring to FIGS. 11 and 12A to 12D, the insulating layer IL may be formed on the entire top surface of the substrate 100. As an example, the insulating layer IL may be a multi-layered structure, in which a silicon oxide layer and a silicon oxynitride layer are stacked. The insulating layer IL may be patterned to form the first contact holes CNH1, each of which exposes a corresponding one of the first source/drain regions SD1 of the active patterns ACT. When the first contact hole CNH1 is formed, an upper portion of the first source/drain region SD1 may be partially recessed. Similarly, when the first contact hole CNH1 is formed, an upper portion of the device isolation layer ST around the first source/drain region SD1 may be partially recessed.

Referring to FIGS. 13 and 14A to 14D, a first conductive layer CL1, a barrier layer BAL, and a second conductive layer CL2 may be sequentially formed on the insulating layer IL. The first conductive layer CL1 may be in (e.g., may fill) the first contact holes CNH1. In other words, the first conductive layer CL1 may be in contact with the first source/drain regions SD1 of the active patterns ACT. The first conductive layer CL1 may be vertically spaced apart from the second source/drain regions SD2 of the active patterns ACT by the insulating layer IL. The first conductive layer CL1 may be formed of or include at least one of various doped semiconductor materials.

The barrier layer BAL may be formed to be interposed between the first conductive layer CL1 and the second conductive layer CL2. The barrier layer BAL may be formed of or include at least one of various conductive metal nitrides. The second conductive layer CL2 may be formed of or include at least one of various metallic materials. The barrier layer BAL may prevent or suppress a metallic material in the second conductive layer CL2 from being diffused into the first conductive layer CL1.

Referring to FIGS. 15 and 16A to 16D, the line structures LST may be formed on the insulating layer IL to be extended in the first direction D1 and parallel to each other. The line structures LST may be arranged (e.g., spaced apart from each other) in the second direction D2.

In detail, the mask patterns MP may be formed on the second conductive layer CL2. The mask patterns MP may be formed to have a line shape extending in the first direction D1. As an example, the mask patterns MP may be formed of or include at least one of silicon nitride or silicon oxynitride.

The bit line BL, the barrier pattern BP, and the conductive pattern CP may be formed by sequentially patterning the second conductive layer CL2, the barrier layer BAL, and the first conductive layer CL1, respectively, using the mask patterns MP as a mask. The mask pattern MP, the bit line BL, the barrier pattern BP, and the conductive pattern CP may be vertically overlapped with each other. The mask pattern MP, the bit line BL, the barrier pattern BP, and the conductive pattern CP may constitute the line structure LST. When viewed in a plan view, the bit lines BL may be extended to cross the gate electrodes GE.

The conductive pattern CP may include contact portions CNP, each of which is in (e.g., fills) the first contact holes CNH1, respectively. The conductive pattern CP may be connected to the first source/drain region SD1 through the contact portion CNP. In other words, the bit line BL may be electrically connected to the first source/drain region SD1 through the conductive pattern CP.

The pair of spacers SP may be formed on opposite side surfaces of each of the line structures LST. The formation of the spacers SP may include conformally forming a spacer layer on the entire top surface of the substrate 100 and anisotropically etching the spacer layer.

An etching process using the spacers SP and the mask patterns MP as a mask may be performed on the entire top surface of the substrate 100 to form the second contact holes CNH2 exposing the second source/drain regions SD2, respectively. In detail, the second contact hole CNH2 may be formed to penetrate the insulating layer IL and may be extended to a level lower than the top surface of the substrate 100. When the second contact hole CNH2 is formed, an upper portion of the second source/drain region SD2 may be partially recessed. When the second contact hole CNH2 is formed, an upper portion of the device isolation layer ST around the second source/drain region SD2 may be partially recessed.

The process of forming the second contact hole CNH2 will be described in more detail with reference to FIGS. 19 and 20. Referring to FIG. 19, an anisotropic etching process using the spacers SP and the mask patterns MP as a mask may be performed on the entire top surface of the substrate 100 to form the second contact holes CNH2. The second contact holes CNH2 may be formed in a self-aligned manner by using the spacers SP and the mask patterns MP. The insulating layer IL may be etched during the anisotropic etching process. The anisotropic etching process may be performed in an over-etching manner, and in this case, the upper portion of the active pattern ACT and the upper portion of the device isolation layer ST may be partially etched.

Referring to FIG. 20, a cleaning process may be performed on the second contact holes CNH2 to selectively recess the exposed portions of the device isolation layer ST. Since only the device isolation layer ST, not the active pattern ACT, is selectively etched, a vertical extension hole VEH, which is extended toward the bottom of the substrate 100, may be formed below the second contact hole CNH2. The vertical extension hole VEH may be formed to expose the upper side surface USW of the active pattern ACT.

Referring to FIGS. 17 and 18A to 18D, a plurality of the insulating fences IFS may be formed on the gate capping layer GP. The insulating fences IFS may not be overlapped with the second contact holes CNH2 and may expose the second contact holes CNH2.

The contacts CNT may be formed in the second contact holes CNH2, respectively, by filling the second contact holes CNH2 with a conductive material. The contacts CNT may be connected to the second source/drain regions SD2. In detail, the conductive material may be formed on the entire top surface of the substrate 100 and then may be recessed until a top surface of the conductive material is lower than top surfaces of the insulating fences IFS. In this case, the conductive material may be cut by the insulating fences IFS, and as a result, the contacts CNT may be formed in the second contact holes CNH2, respectively. The contacts CNT and the insulating fences IFS may be alternately arranged in the first direction D1.

The conductive material filling the second contact holes CNH2 may be formed of or include at least one of various doped semiconductor materials. In an embodiment, the second contact holes CNH2 may be filled with a doped semiconductor material, and then, impurities in the semiconductor material may be diffused into the second source/drain regions SD2. The diffusion of the impurity may be performed using a metallurgical process.

Meanwhile, in the case where there is a structural variation between the second contact holes CNH2, the diffusion of the impurity into the second source/drain regions SD2 may occur in different manner from region to region. This may lead to the afore-described technical issues, such as a variation in doping profile of the second source/drain region SD2 and variations in electric characteristics of P-N junctions and metallurgical junctions. By contrast, according to an embodiment of the inventive concept, the vertical extension hole VEH may be configured to reduce the structural variation between the second contact holes CNH2, and thus, it may be possible to suppress the afore-described technical issues.

Referring back to FIGS. 1 and 2A to 2D, the landing pads LP may be formed on the contacts CNT, respectively. In detail, a metal layer may be formed on the contacts CNT and the insulating fences IFS. The metal layer may be patterned to form the landing pads LP. The insulating pattern INP may be formed by filling a space between the landing pads LP with an insulating material. The first electrodes LEL may be formed on the landing pads LP, respectively. The dielectric layer HDL may be conformally formed on the first electrodes LEL. The second electrode TEL may be formed on the dielectric layer HDL. The first electrode LEL, the dielectric layer HDL, and the second electrode TEL may constitute the data storing element DS (e.g., a capacitor). Although not shown, interconnection layers (e.g., layers of metal interconnection lines) may be stacked on the second electrode TEL.

In a semiconductor memory device (e.g., a DRAM device) according to an embodiment of the inventive concept, a contact area between a contact and a second source/drain region may be increased, and thus, a resistance therebetween may be lowered. Furthermore, a vertically-extended portion may be provided to reduce a structural variation between contacts caused by misalignment therebetween. Accordingly, it may be possible to improve gate-induced-drain-leakage (GIDL) characteristics of the device. As a result, it may be possible to improve electrical and operational characteristics of the semiconductor device.

While example embodiments of the inventive concept have been particularly shown and described, it will be understood by one of ordinary skill in the art that variations in form and detail may be made therein without departing from the scope of the attached claims.

What is claimed is:

1. A method of fabricating a semiconductor memory device, the method comprising:
    patterning a substrate to form a first trench defining an active pattern;
    forming a device isolation layer in the first trench;
    forming a gate electrode to cross the active pattern and to extend in a first direction;
    forming a first source/drain region and a second source/drain region in an upper portion of the active pattern, the first and second source/drain regions being adjacent to respective opposite sides of the gate electrode;
    forming an insulating layer on the active pattern;
    forming a line structure on the insulating layer to cross the active pattern and to extend in a second direction, the line structure comprising a bit line electrically connected to the first source/drain region and a mask pattern on the bit line;
    forming a spacer on a side surface of the line structure;
    forming a contact to penetrate the insulating layer and to be coupled to the second source/drain region;
    forming a landing pad on the contact; and
    forming a data storing element on the landing pad,
    wherein the forming of the contact comprises:
        performing an anisotropic etching process using the mask pattern and the spacer as a mask to form a first contact hole penetrating the insulating layer;
        selectively recessing an upper portion of the device isolation layer exposed by the first contact hole to form a vertical extension hole exposing an upper side surface of the active pattern; and
        forming a conductive material in the first contact hole and the vertical extension hole,
    wherein during the anisotropic etching process, a top surface of the active pattern is recessed to form a recessed top surface.

2. The method of claim 1, wherein the forming of the gate electrode comprises:
    forming a second trench to penetrate the upper portion of the active pattern and to extend in the first direction; and
    sequentially forming a gate dielectric layer, the gate electrode, and a gate capping layer in the second trench.

3. The method of claim 1, wherein the recessing of the upper portion of the device isolation layer includes performing a cleaning process to selectively etch the device isolation layer.

4. The method of claim 1, wherein the landing pad is formed to be offset from a center of the contact.

5. The method of claim 1, wherein the contact comprises:
    a lower portion that is in the first contact hole and is in contact with the recessed top surface; and
    a vertically-extended portion that is in the vertical extension hole and is in contact with the upper side surface.

6. The method of claim 5, wherein a width of the lower portion of the contact decreases with decreasing distance from a bottom of the substrate.

7. The method of claim 1, wherein the forming of the line structure comprises:
    forming a second contact hole in the insulating layer to expose the first source/drain region;
    sequentially forming a first conductive layer, a barrier layer, and a second conductive layer on the insulating layer, the first conductive layer being in contact with the first source/drain region through the second contact hole;
    forming the mask pattern on the second conductive layer to extend in the second direction; and
    patterning the first conductive layer, the barrier layer, and the second conductive layer using the mask pattern as a mask.

8. The method of claim 7, wherein the first source/drain region has a planar surface exposed by the second contact hole, and
    wherein the planar surface of the first source/drain region is higher than a lowermost level of the vertical extension hole.

9. A method of fabricating a semiconductor memory device, the method comprising:
    patterning a substrate to form a first active pattern, a second active pattern, and a third active pattern that are sequentially arranged in a first direction;
    forming a bit line to cross the second active pattern and to extend in a second direction, the bit line being electrically connected to the second active pattern;
    forming a first contact to be coupled to the first active pattern;
    forming a second contact to be coupled to the third active pattern;
    forming landing pads on the first and second contacts, respectively; and forming data storing elements on the landing pads, respectively, wherein the forming of the first contact comprises:

forming a first contact hole to expose a curved top surface of the first active pattern; and forming a first conductive material in the first contact hole, wherein the forming of the second contact comprises:

forming a second contact hole to expose a curved top surface of the third active pattern; and forming a second conductive material in the second contact hole, wherein a lowermost level of the curved top surface of the first active pattern is at a first level, wherein a lowermost level of the curved top surface of the third active pattern is at a second level, wherein a lowermost level of the first contact hole is at a third level, wherein a lowermost level of the second contact hole is at a fourth level, and wherein a difference between the first level and the second level is greater than a difference between the third level and the fourth level.

10. The method of claim 9, further comprising forming a gate electrode to cross the first to third active patterns in the first direction.

11. The method of claim 9, wherein the curved top surface of the first active pattern has an average slope defining a first angle, wherein the curved top surface of the third active pattern has an average slope defining a second angle, and wherein the second angle is smaller than the first angle.

12. The method of claim 9, further comprising forming a device isolation layer between the first active pattern and the second active pattern, and between the second active pattern and the third active pattern.

13. The method of claim 12, wherein the forming of the first contact further comprises selectively recessing an upper portion of the device isolation layer exposed by the first contact hole to form a first vertical extension hole exposing an upper side surface of the first active pattern.

14. The method of claim 12, wherein the forming of the second contact further comprises selectively recessing an upper portion of the device isolation layer exposed by the second contact hole to form a second vertical extension hole exposing an upper side surface of the third active pattern.

15. A method of fabricating a semiconductor memory device, the method comprising:

patterning a substrate to form a first active pattern, a second active pattern, and a third active pattern that are sequentially arranged in a first direction;

forming a device isolation layer between the first active pattern and the second active pattern, and between the second active pattern and the third active pattern;

forming a bit line to cross the second active pattern and to extend in a second direction, the bit line being electrically connected to the second active pattern;

forming a first contact to be coupled to the first active pattern;

forming a second contact to be coupled to the third active pattern;

forming landing pads on the first and second contacts, respectively; and forming data storing elements on the landing pads, respectively, wherein the forming of the first and second contacts comprises:

performing an anisotropic etching process to form a first contact hole exposing a curved top surface of the first active pattern and a second contact hole exposing a curved top surface of the third active pattern;

selectively recessing an upper portion of the device isolation layer exposed by the first and second contact holes to form a first vertical extension hole exposing an upper side surface of the first active pattern and a second vertical extension hole exposing an upper side surface of the third active pattern, respectively; and forming a conductive material in the first and second contact holes and the first and second vertical extension holes.

16. The method of claim 15, wherein the first vertical extension hole is formed to extend downward from a bottom of the first contact hole, and wherein the second vertical extension hole is formed to extend downward from a bottom of the second contact hole.

17. The method of claim 15, wherein a depth difference between the first contact hole and the second contact hole is greater than a depth difference between the first vertical extension hole and the second vertical extension hole.

18. The method of claim 15, further comprising forming a gate electrode to cross the first to third active patterns in the first direction.

19. The method of claim 15, wherein the curved top surface of the first active pattern has an average slope defining a first angle, wherein the curved top surface of the third active pattern has an average slope defining a second angle, and wherein the second angle is smaller than the first angle.

20. The method of claim 15, wherein the first contact is formed to be in direct contact with the curved top surface and the upper side surface of the first active pattern, and wherein the second contact is formed to be in direct contact with the curved top surface and the upper side surface of the third active pattern.

* * * * *